United States Patent
Tuncer

(10) Patent No.: US 11,614,482 B1
(45) Date of Patent: Mar. 28, 2023

(54) METHOD FOR MANUFACTURING SEMICONDUCTOR DEVICE PACKAGE WITH ISOLATION

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/566,607

(22) Filed: Dec. 30, 2021

(51) Int. Cl.
  *G01R 31/28* (2006.01)
  *G01R 15/20* (2006.01)

(52) U.S. Cl.
  CPC ....... *G01R 31/2853* (2013.01); *G01R 15/202* (2013.01); *G01R 31/2886* (2013.01); *G01R 31/2896* (2013.01)

(58) Field of Classification Search
  CPC .............. G01R 31/2853; G01R 15/202; G01R 31/2886; G01R 31/2896
  USPC ................................ 324/762.02, 762.01, 537
  See application file for complete search history.

(56) References Cited

U.S. PATENT DOCUMENTS

| | | |
|---|---|---|
| 2021/0231729 A1 | 7/2021 | You et al. |
| 2021/0313258 A1* | 10/2021 | Tuncer .............. H01L 23/49861 |
| 2022/0319988 A1* | 10/2022 | Tuncer ................ H01L 23/5256 |
| 2022/0352054 A1* | 11/2022 | Tuncer ................ H01L 23/3114 |

* cited by examiner

Primary Examiner — Giovanni Astacio-Oquendo
(74) Attorney, Agent, or Firm — Dawn Jos; Frank D. Cimino

(57) ABSTRACT

A method includes placing a semiconductor device package in a test handler, the semiconductor device package having leads of a first portion of a package substrate extending from a mold compound and leads of a second portion isolated from the first portion extending from the mold compound; contacting the first portion with a first and a second conductive slug; contacting the second portion with a third and a fourth conductive slug; contacting a first surface of the mold compound with a first plunger having a conductive plate and an insulating tip; contacting an opposite second surface of the mold compound with a second plunger having a conductive plate and an insulating tip; and placing a high voltage on the first conductive slug while placing approximately half the high voltage on the conductive plate of the first plunger, and placing a ground voltage on the third conductive slug.

20 Claims, 17 Drawing Sheets

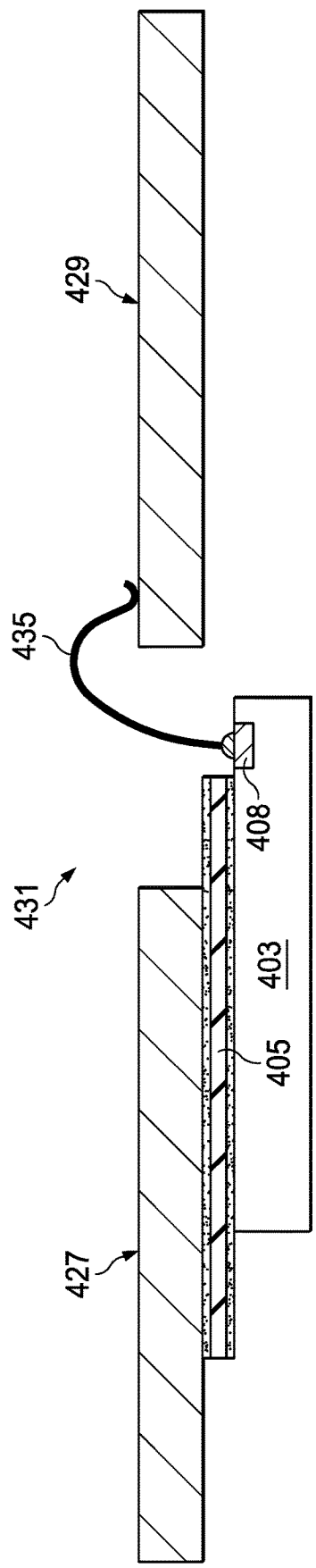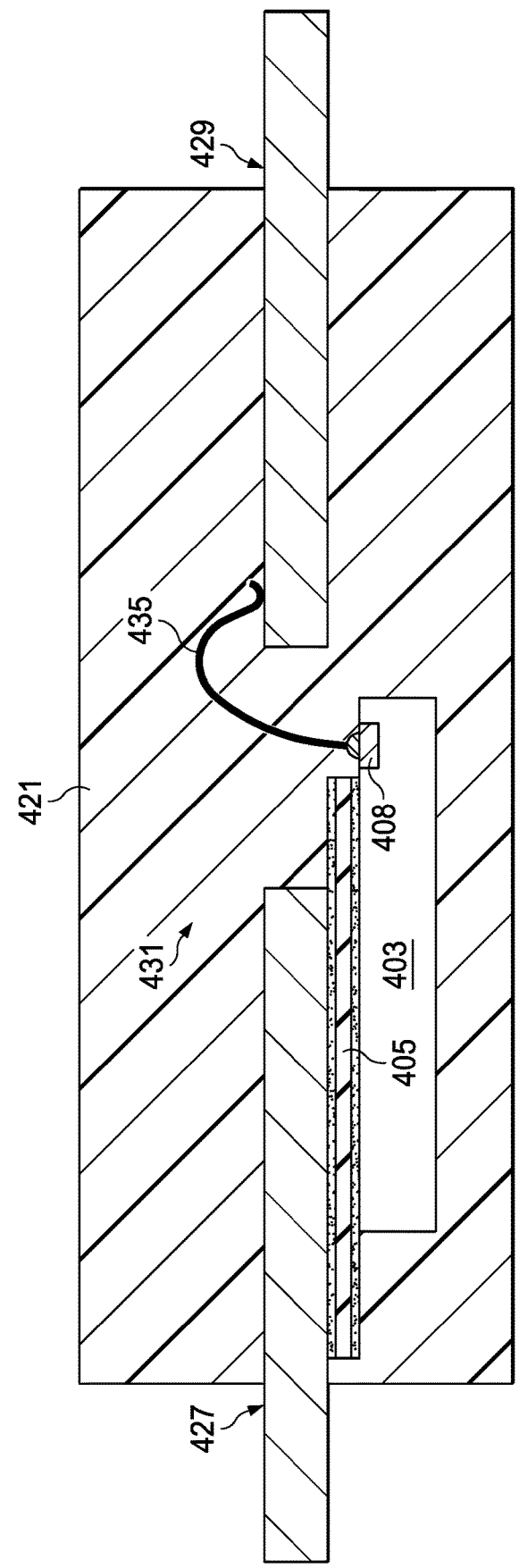

|  | $S_V$@3V/um[x$10^{-12}$] |
|---|---|
| PRIOR APPROACH | 75.59 |
| CASE 1 - SINGLE BLADE PERMITTIVITY 3.2 | 9.43 |
| CASE 2 SINGLE BLADE WITH POLYMER, PERMITTIVITY 1.0 | 2.94 |
| CASE 3 4 BLADES PERMITTIVITY 2.1 | 29.96 |
| CASE 4 WITH METAL PERMITTIVITY 2.1 | 73.61 |

METHOD FOR MANUFACTURING SEMICONDUCTOR DEVICE PACKAGE WITH ISOLATION

TECHNICAL FIELD

This relates generally to manufacturing semiconductor devices, and more particularly to manufacturing semiconductor device packages with integrated isolation for a semiconductor die, including testing of the completed semiconductor device packages.

BACKGROUND

For integrated devices with internal isolation in a semiconductor device package, semiconductor dies are separated from high voltage signals by an isolation barrier. For example, a semiconductor die with an integral Hall element configured as a current sensor can be mounted to a package substrate, such as a lead frame, by dielectric materials. A high voltage input signal, having a maximum voltage of hundreds of volts, a kilovolt or several kilovolts, can be coupled to the lead frame. A Hall current sensor within the semiconductor die will output a signal that varies in response to a magnetic field caused by the current flowing in portions of the lead frame, while the semiconductor die remains electrically isolated from the high voltage. The package substrate can include additional leads that are also isolated from the high voltage. Additional leads can be coupled to the semiconductor die to provide power, control, and output signals for the semiconductor die. Other types of semiconductor devices needing electrical isolation can be mounted in a semiconductor device package. For example, a pair of semiconductor dies may form a transformer with inductors having coils spaced by an isolation dielectric layer, this arrangement enables the transmission of power across isolated components without direct connection between components at differing voltages.

In manufacturing semiconductor device package with isolation, tests are performed to verify the isolation is sufficiently robust for the application. A completed semiconductor device package may be placed in a test handler with high voltage capability. A portion of the test handler supplies a high voltage to package leads that are arranged to receive a high voltage. Another portion of the test handler is coupled to leads of the package that are isolated from the high voltage, and measurements are made to determine if the high voltage is being isolated from the isolated leads. The measurements include applying a high voltage to the packaged device and determining if the isolation is effective.

The high voltage input to the semiconductor device package can create a high electric field. Dielectric materials such as die attach and mold compound can fail in the high electric field, causing defects, arcing, and shorts. Arcs and shorts in the test handler may result in incorrect test results, indicating a failure in the isolation when current flows that are due to electric field arcs in air pass around the device under test and the arc current appears as current flow in the test handler. To provide a robust semiconductor device package with the capability of being coupled to a high voltage in the kilovolts range, the semiconductor device package needs to be designed to be compatible with high voltages at the inputs and to be able to sustain the resulting electric fields without damage to the semiconductor device package or to the semiconductor die. During a high voltage isolation test, the electric field that results at the test handler when the high voltage is applied needs to be managed to prevent excess field concentration at the tester from an incorrect test result or to prevent arc current damage to an otherwise good semiconductor device and package.

SUMMARY

In a described example, a method for testing isolation in a semiconductor device package includes: placing a semiconductor device package in a test handler, the semiconductor device package having first leads of a first portion of a package substrate extending from a mold compound forming a package body of the semiconductor device package and having second leads of a second portion of the package substrate extending from the mold compound, the first portion electrically isolated from the second portion; contacting the first leads of the first portion with a first conductive slug and a second conductive slug of the test handler; contacting the second leads of the second portion with a third conductive slug and a fourth conductive slug of the test handler, the third conductive slug and the fourth conductive slug spaced from the first conductive slug and the second conductive slug; contacting a first surface of the mold compound with a first plunger having a conductive plate and an insulating tip, the insulating tip in contact with the first surface of the mold compound; contacting a second surface of the mold compound opposite the first surface of the mold compound with a second plunger, the second plunger having a conductive plate and an insulating tip, the insulating tip in contact with the second surface of the mold compound; and placing a high voltage on the first conductive slug and the second conductive slug, while placing approximately half the high voltage on the conductive plate of the first plunger and on the conductive plate of the second plunger, and while placing a ground voltage on the third conductive slug and the fourth conductive slug.

In another described example, another method includes: forming semiconductor dies on a semiconductor wafer; forming a package substrate comprising a first portion and a second portion spaced from and electrically isolated from the first portion, the package substrate comprising a conductive lead frame, the first portion having a device side surface and an opposite surface; mounting a first surface of a spacer dielectric having the first surface and a second surface opposite the first surface to the device side surface of the first portion of the package substrate, the spacer dielectric partially covered by the first portion, and extending beyond the first portion; mounting one of the semiconductor dies to the second surface of the spacer dielectric, the one of the semiconductor dies partially covered by the spacer dielectric and having a bond pad formed on a surface of the semiconductor die that extends beyond the spacer dielectric; coupling the bond pad of the semiconductor die by making an electrical connection from the bond pad to a lead that is formed of the second portion of the lead frame; covering the semiconductor die, the electrical connection, the spacer dielectric, and partially covering the first portion of the lead frame and partially covering the second portion of the lead frame in a mold compound; forming a semiconductor device package by shaping first leads of the first portion that extend from the mold compound and by shaping second leads of the second portion that extend from the mold compound; bringing a first conductive slug and a second conductive slug of a test handler into contact with the first leads of the first portion; bringing a third conductive slug and a fourth conductive slug of the test handler into contact with the second leads of the second portion; bringing a first plunger having a conductive plate and an insulating tip into contact with a first surface of the mold compound of the semiconductor device package, the first plunger located between the first slug and the third slug of the test handler; bringing a second plunger having a conductive plate and an insulating tip into contact with a second surface of the mold compound of the semiconductor device package on a side opposite the first surface of the mold compound, the second plunger placed opposite the first plunger and between the second slug and the fourth slug of the test handler; and placing a high voltage on the first leads of the first portion, placing a voltage that is approximately half the high voltage on the conductive plate of the first plunger and on the conductive plate of the second plunger, and placing a ground voltage on the second leads of the second portion.

In a further described example, a test handler for performing a high voltage isolation test on a semiconductor device package includes: a first conductive slug and a second conductive slug configured to contact first leads of a first portion of a package substrate of the semiconductor device package, the first conductive slug and the second conductive slug configured to be coupled to a high voltage; a third conductive slug and a fourth conductive slug configured to contact the second leads of a second portion of the package substrate of the semiconductor device package, the third conductive slug and the fourth conductive slug configured to be coupled to a ground voltage; a first plunger configured to contact a first surface of a mold compound forming the body of the semiconductor device package the first plunger including a conductive plate and an insulating tip arranged to contact the first surface of the mold compound, the conductive plate configured to be coupled to a voltage that is approximately one half the high voltage; and a second plunger configured to contact a second surface of the mold compound opposite the first surface of the mold compound, the second plunger including a conductive plate and an insulating tip arranged to contact the second surface of the mold compound, the conductive plate configured to be coupled to the voltage that is approximately one half the high voltage.

BRIEF DESCRIPTION OF THE DRAWINGS

FIGS. 4A-4F illustrate, in a series of cross sectional views, selected steps in forming a semiconductor device package that can be used in an arrangement.

DETAILED DESCRIPTION

Figure 1:
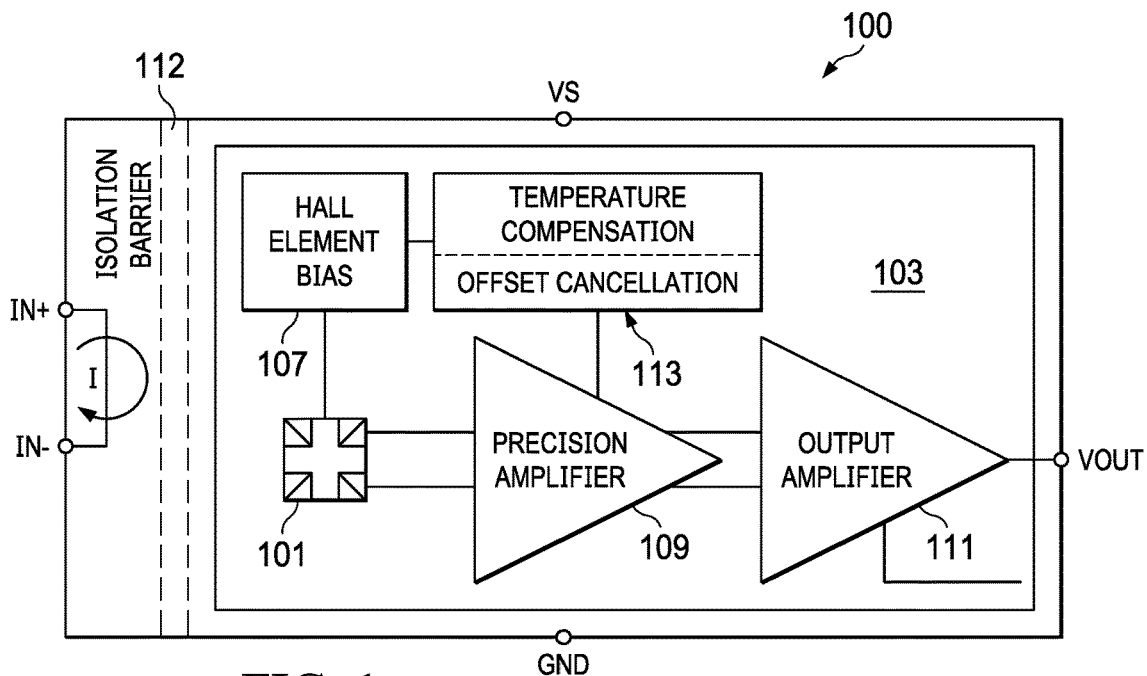
FIG. 1 illustrates a circuit block diagram for a Hall current sensing device with isolation for use in arrangement.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. Semiconductor dies for power applications useful in the arrangements include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package. In example arrangements, a semiconductor die includes a Hall element configured as a current sensor.

The term "semiconductor device package" is used herein. A semiconductor device package has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing the package substrate and a backside surface facing away from the package substrate. The semiconductor device package can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the semiconductor device package.

The term "package substrate" is used herein. A package substrate is a substrate arranged to receive a semiconductor die and to support the semiconductor die in a completed semiconductor device package. Package substrates include conductive lead frames, which can be formed from copper, aluminum, stainless steel, steel and alloys such as Alloy 42. The lead frames can include a die pad for mounting the semiconductor die, and conductive leads arranged spaced from the die pad for electrical connections coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound. The completed devices can then be removed one from another by cutting through the mold compound and the package substrate between the mounted semiconductor dies.

The lead frames can include plated, stamped and partially etched lead frames. In a partially etched lead frame, two levels of metal can be formed form a sheet of material by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant 4 (FR4).

Leaded packages can be used with the arrangements where the leads extend away from the package body and are shaped to form a portion for soldering to a board. A dual in line package, or "DIP", can be used with the arrangements. A thin DIP package arranged with leads for surface mounting that meets certain size specifications can be referred to as a small outline integrated circuit or "SOIC" package.

The term "spacer dielectric" is used herein. A spacer dielectric is in insulating layer that provides electrical isolation between devices mounted to it. Spacer dielectrics for use in the arrangements include printed circuit board materials, such as flame retardant 4 (FR4), glass reinforced epoxy or fiber substrates, bismaleimide triazine resin (BT) resin, ceramics, other epoxies, resins, tapes and films. The spacer dielectric can be a laminate of layered dielectric materials.

The term "test handler" is used herein. In the arrangements, a test handler is a tester that can receive a semiconductor device package, transfer the semiconductor device package to a test area, perform a high voltage test, and transfer the semiconductor device package out of the tester. The arrangements configure elements of a test handler to manage electric field concentrations around a semiconductor device package during a high voltage test.

In the arrangements, a semiconductor device package includes a package substrate that has a first portion spaced from and electrically isolated from a second portion. The package substrate may be a conductive lead frame. The first portion of the conductive lead frame includes a first lead (or first group of leads) to be coupled to a first node and a second lead (or second group of leads) to be coupled to a second node. The first portion includes a conductive path for carrying a current between the first node and the second node. A spacer dielectric is mounted to a device side surface of the first portion of the lead frame, the first portion has an opposite surface opposite the device side surface. A semiconductor die that includes a current sensor is mounted to the spacer dielectric so that the semiconductor die is electrically isolated from the first portion of the lead frame. The semiconductor die is arranged to lie within a magnetic field that will occur due to a current flowing in the current carrying portion of the first portion of the lead frame. In an example the semiconductor die includes a Hall element configured as a current sensor. Electrical connections are made between bond pads on the semiconductor die and a third lead in the second portion of the lead frame. A mold compound covers at least part of the first portion and the second portion of the lead frame, the spacer dielectric, and the semiconductor die; the first lead, the second lead and the third lead include portions that are exposed from the mold compound to form package terminals. The first portion of the lead frame, including terminals formed from conductive leads external to the mold compound in the semiconductor device package is electrically isolated from the semiconductor die and from the second portion of the lead frame, including terminals formed from conductive leads.

In a test handler, a high voltage, for example a voltage in the hundreds of volts or in the kilovolt range, is applied to the first portion of the lead frame, while the second portion of the lead frame is held at a reference potential. To test the isolation of the semiconductor device package, current measurements are made to verify that less than a predetermined amount of current flows between the first portion and the second portion of the lead frame when the high voltage is applied to the first portion, confirming the electric isolation.

In the arrangements, structures are formed to curtail the concentration in the electric field that occurs when a high voltage is coupled to the first portion of the lead frame in a test handler, for example when a high voltage greater than several hundred volts. In example tests a high voltage greater than 300 volts, or higher voltages, such as 1 kV or up to several kilovolts, is coupled to the first portion of the lead frame by use of conductive slugs. A pair of plungers arranged to contact the mold compound forming the body of the semiconductor device package are arranged on either side of the semiconductor device package, and the plungers contact and hold the semiconductor device package. In one arrangement, the plungers include a conductive plate or blade with an insulating tip that contacts the mold compound of the semiconductor device package, for example the plungers can be a copper plate or copper blade with a polymeric tip. During high voltage tests, a pair of conductive slugs that are arranged to contact either side of the terminals that are formed by the leads of the first portion of the lead frame are placed at a high voltage. The conductive blades of the plungers are placed at voltage that corresponds to approximately half of the high voltage, while another pair of slugs contacts the terminals of the semiconductor device package that are formed by the leads of the second portion of the lead frame, which is at a ground or reference potential less than the high voltage. By placing the conductive part of the plungers at a voltage that is equal to half or approximately half the high voltage applied across the terminals of the semiconductor device package, the electric field in the test handler is managed, and the electric field concentration around and within the semiconductor device package is distributed, reducing or preventing high field concentrations and preventing arcs due to dielectric breakdown in the air around semiconductor device package when the high voltage test is performed. Arcs can carry current that results in an erroneous test result, and which can damage the semiconductor device package.

FIG. 1 is a circuit block diagram for a semiconductor device package 100 that is one example semiconductor device package that can be used in an arrangement. The example semiconductor device package 100 is a Hall current sensor. Other circuits, for example for devices that employ transformers with isolation, can be used with the arrangements. In addition to current sensing for high voltage signals, additional applications for isolation in a semiconductor device package include power transmission across voltage regimes at separate ground potentials, and communications, for example in isolated signaling between transceiver devices operating at different voltage potentials. Power supply circuitry including alternating current (AC) isolation, DC-DC converters, and load protection circuitry can be used with the arrangements. The arrangements provide high voltage testing to verify isolation in a semiconductor device package, and can be used with many devices including electrical isolation.

In FIG. 1, an input IN+ can be coupled to a first node and can receive a signal carrying current labeled "I", for example the node at IN+ may be coupled to a high voltage signal or voltage supply, and an output IN− can be coupled to a second node, output IN− outputs the current I. A semiconductor die 103 within semiconductor device package 100 includes a Hall element 101. Circuitry needed to control and monitor the Hall element 101 are provided including a Hall Element Bias circuit 107, a Temperature Compensation and Offset Cancellation circuit 113, a Precision Amplifier 109, and an Output Amplifier 111.

In operation, the output amplifier 111 drives an output VOUT that corresponds to the magnitude of the current I or which changes with variations in the current I. A magnetic field that occurs due to the current I is sensed by the Hall element 101, and a voltage VOUT corresponding to the magnitude of the magnetic field is output by semiconductor die 103. In a system, a calibration scheme can be used to determine the value of the current I from the voltage that appears at the output VOUT. An isolation barrier 112 is shown, the isolation barrier 112 is formed by use of a package substrate with isolated portions to mount the semiconductor die 103 within the magnetic field due to current I, while keeping the semiconductor die electrically isolated from the input IN+ and the output IN− where the current I is supplied. The semiconductor die 103 can be of a material or materials that cannot withstand the high voltage applied at the terminal IN+, and can be made of silicon and can operate at lower voltages, such as 5 Volts or less. This reduces costs of the current sensor and allows use of conventional semiconductor processing to form the semiconductor die 103.

Figure 2C:
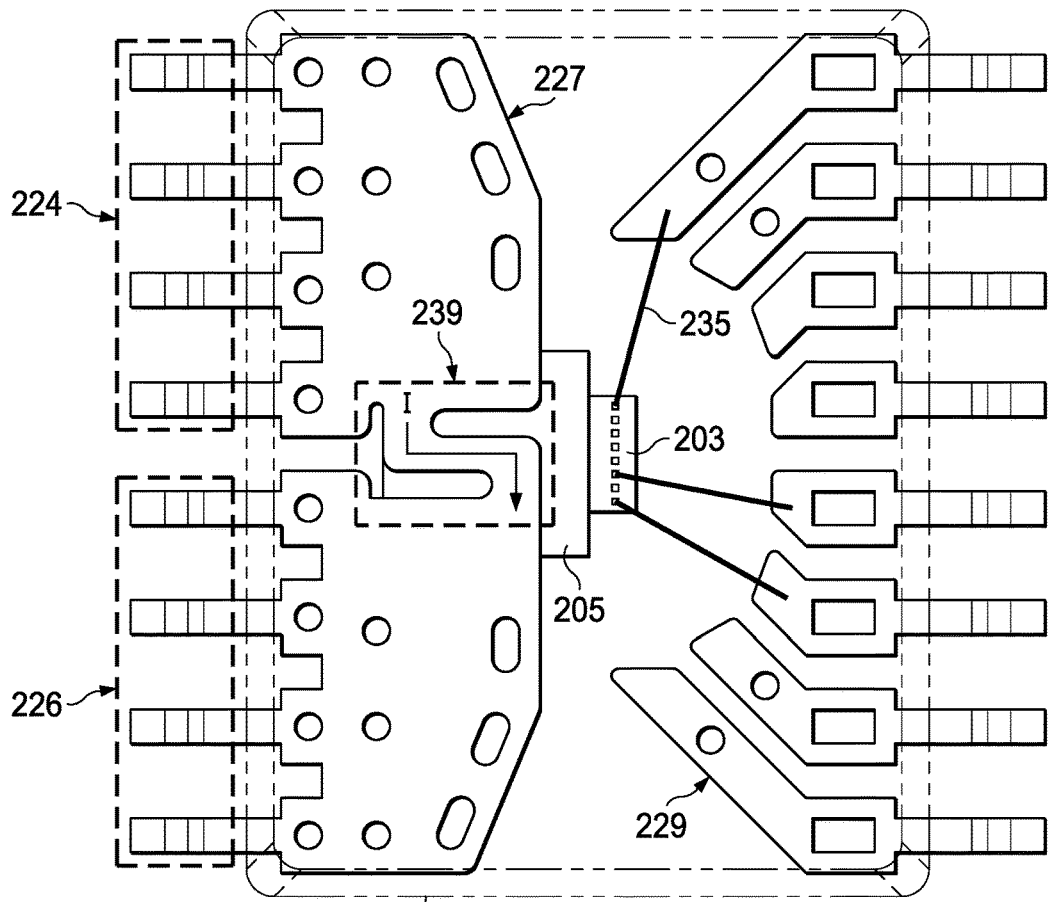
FIGS. 2A-2C illustrate, in a projection view, a partial projection view, and a plan view, a semiconductor device package including a semiconductor die in a semiconductor device package for a Hall current sensor.
Figure 2A:
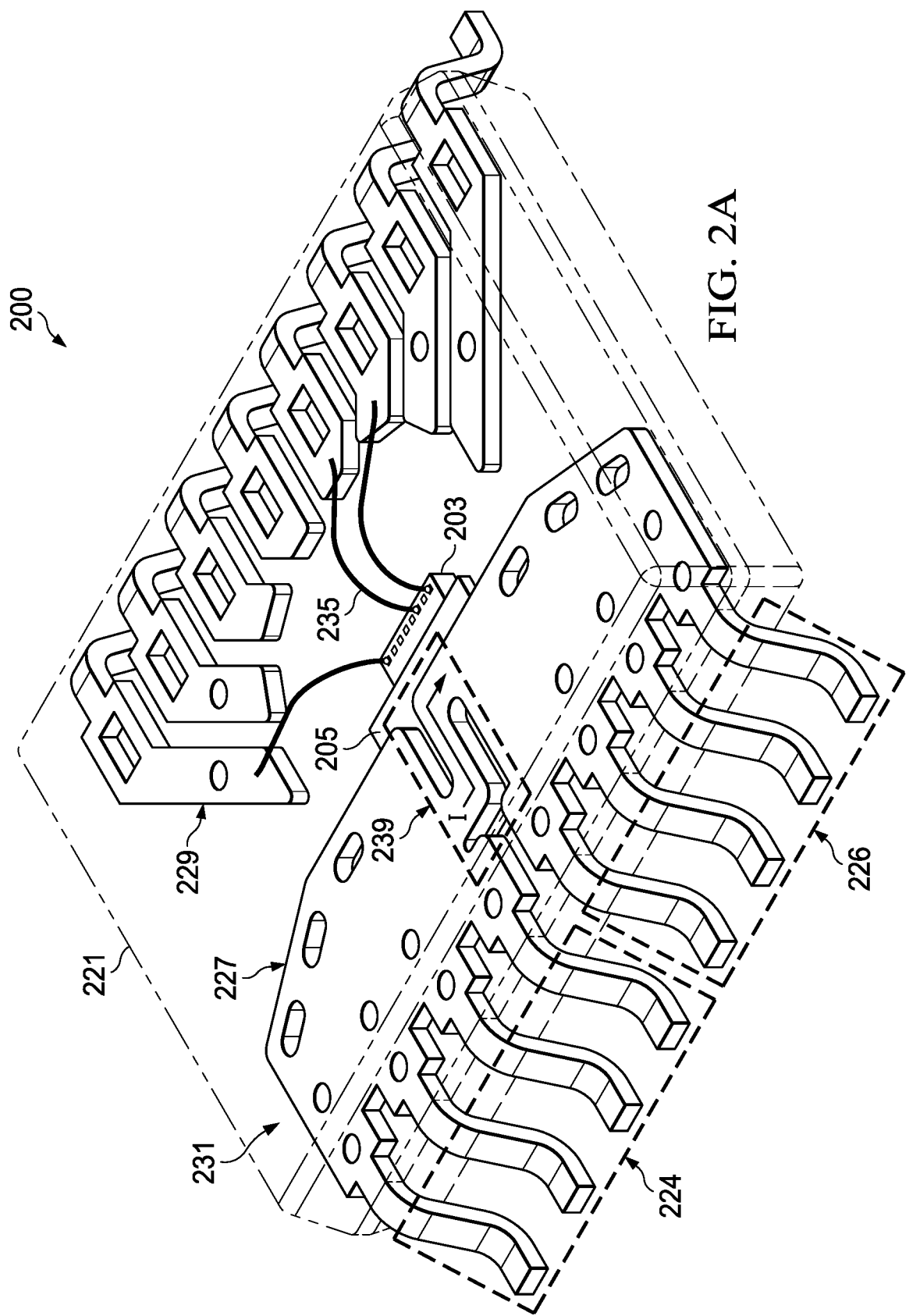

FIG. 2A illustrates, in a projection view, a semiconductor device package 200 for use with an arrangement. A package substrate 231, here a conductive lead frame, is shown with a first portion 227 having several leads, and a second portion 229 having several leads, the first portion 227 and second portion 229 are spaced apart and are electrically isolated from one another. A semiconductor die 203, which can include a Hall element similar to semiconductor die 103 in FIG. 1, is mounted to a spacer dielectric 205, and the spacer dielectric 205 is mounted to the first portion 227 of the package substrate 231. In this manner, the semiconductor die 203 is near, but electrically isolated from, the first portion 227 of the package substrate 231. The second portion 229 of the package substrate 231 is electrically connected to the semiconductor die 203 by electrical connections between the semiconductor die 203 and the leads of the second portion 229; as shown in FIG. 2A. In this example, the electrical connections are bond wires 235, although in an alternative arrangement, ribbon bonds can be used. The semiconductor die 203, the spacer dielectric 205, the bond wires 235, and portions of the package substrate 231 are covered with a mold compound 221, which forms a package body. The spacer dielectric 205 has a portion that extends past the first portions 227 of the lead frame, and the semiconductor die 203 has a portion including the bond pads that extends past the spacer dielectric 205.

The first portion 227 of the package substrate 231 is isolated from the semiconductor die 203 by the spacer dielectric 205, which is an insulator, and by die attach material used to mount the spacer dielectric 205 to the first portion 227; and by die attach used to mount the semiconductor die 203 to the spacer dielectric 205. The package substrate may be a lead frame of a conductive metal, useful examples include copper, gold, Alloy 42, aluminum, stainless steel, steel, and alloys thereof. In examples, a copper lead frame can be used and can have a thickness between about 0.1 and 0.4 millimeters. The conductive lead frame can be formed by stamping or etching a sheet of the conductive material to form conductive leads, die pads, solid portions for low resistance conductive paths or to add strength, divots, holes, openings and slots that form mold compound locks to increase adhesion of mold compound to the lead frame features.

Figure 2B:
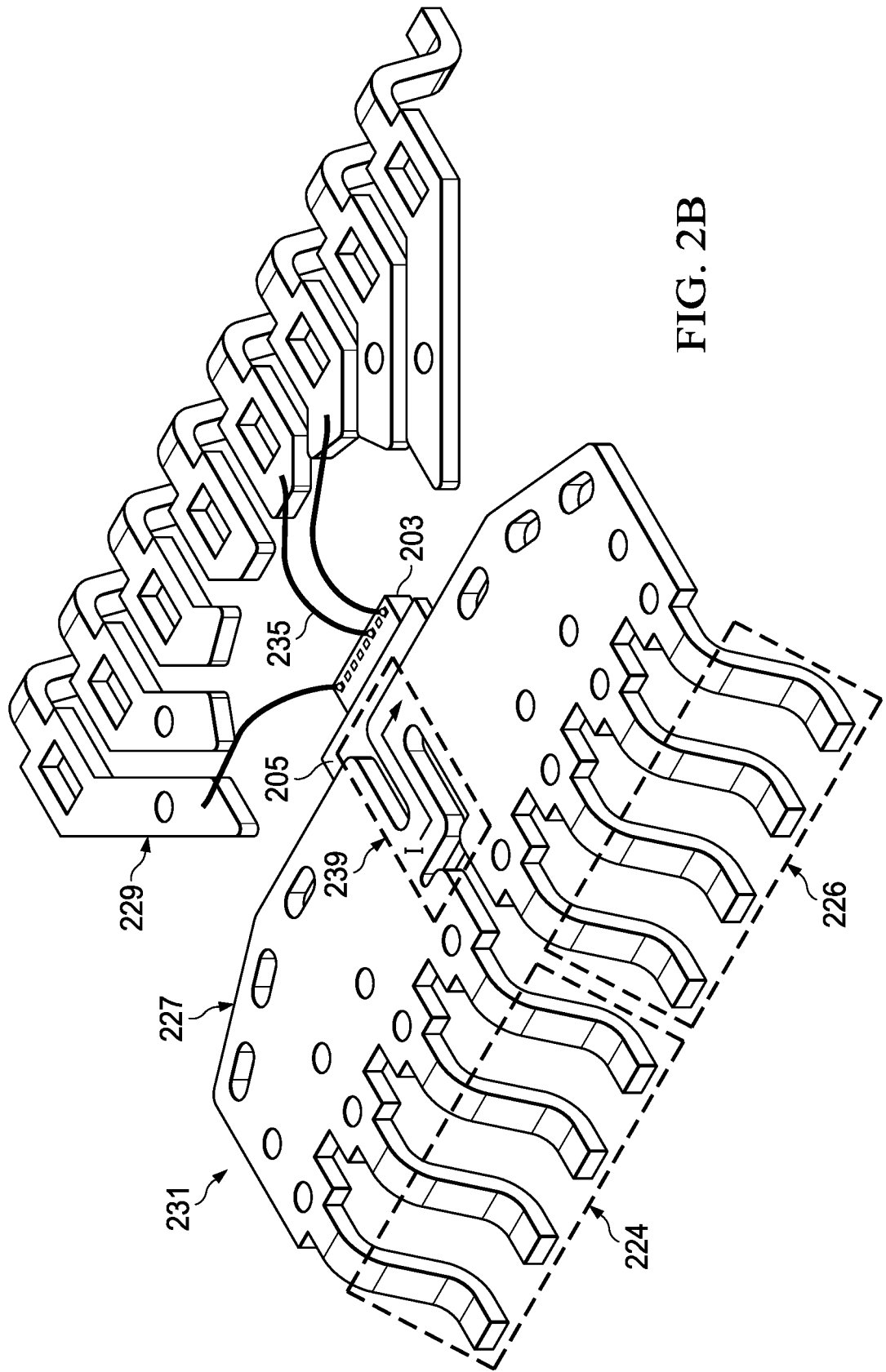

FIG. 2B illustrates features of FIG. 2A in more detail in another projection view, a partial view. In FIG. 2B, the first portion 227 of package substrate 231 has a first lead or first group of leads 224 coupled to receive a current I; for example leads 224 may be coupled to a high voltage signal or supply of greater than several hundred volts, a kilovolt, or several kilovolts. A second set of leads 226 is configured for outputting the current I to a second node. The current I flows through a current sense portion 239 of the first portion 227 and the current I is carried over a portion of the semiconductor die 203. The spacer dielectric 205 is mounted to the first portion 227 of the package substrate 231 on a device side surface. The semiconductor die is mounted to the spacer dielectric 205 on an opposite side from the first portion 227. The first portion 227 of the lead frame has a current sense portion 239 coupled to carry the current I between the first leads 224 and the second leads 226. A portion of the semiconductor die 203 is beneath the current sense portion 239, and is positioned to be within a magnetic field produced by current I in current sense portion 239. The spacer dielectric 205, and die attach material that connects the spacer dielectric 205 to the first portion 227 of the package substrate 231, and die attach that connects the semiconductor die 203 to the spacer dielectric 205, together provide electrical isolation between the semiconductor die 203 and the first portion 227. The second portion 229 of the package substrate 231 is electrically connected to the semiconductor die 203 by bond wires 235. The bond pads of the semiconductor die 203 are exposed from the spacer dielectric 205 by mounting the semiconductor die 203 so that the bond pads are exposed from the spacer dielectric 205, so that only a portion of the semiconductor die 203 is covered by the spacer dielectric 205.

Current sense portion 239 of the first portion 227 is shown over the spacer dielectric 205, and semiconductor die 203 has a portion (not visible in FIG. 2B) that is aligned with the current sense portion 239 so that the semiconductor die 203 is exposed to the magnetic field that occurs due to current I flowing through the current sense portion 239. Current sense portion 239 is a conductor that carries the current I over the semiconductor die 203. In the arrangements the semiconductor die 203 is positioned to place the Hall element within the semiconductor die in the magnetic field, to allow sensing of the magnetic field due to current I.

FIG. 2C illustrates the semiconductor device package 200 in a plan view, to better illustrate certain aspects. In FIG. 2C, the first portion 227 of the lead frame includes a first lead or first group of leads 224, and a second lead or second group of leads 226. First leads 224 receive a current I from a first node, which can be a high voltage signal greater than several hundred volts, greater than 1 kV and up to several kilovolts, and the second lead or second group of leads 226 are arranged to be coupled to a second node to output the current I. Current sense portion 239 is coupled between the first leads 224 and second leads 226 and is positioned over the spacer dielectric 205, and over a portion of the semiconductor die 203. A portion of the semiconductor die 203 is aligned with current sense portion 239 so that a magnetic field due to the current I flowing through the first portion 227 of the lead frame reaches the Hall element current sensor in the semiconductor die 203. The second portion 229 of the lead frame is coupled by bond wires 235 to bond pads on the semiconductor die. Mold compound 221 covers the semiconductor die 203, the spacer dielectric 205, the bond wires 235, and partially covers the lead frame including first portion 227 and the second portion 229, while leads of the lead frame are exposed from the mold compound 221.

Figure 2D:
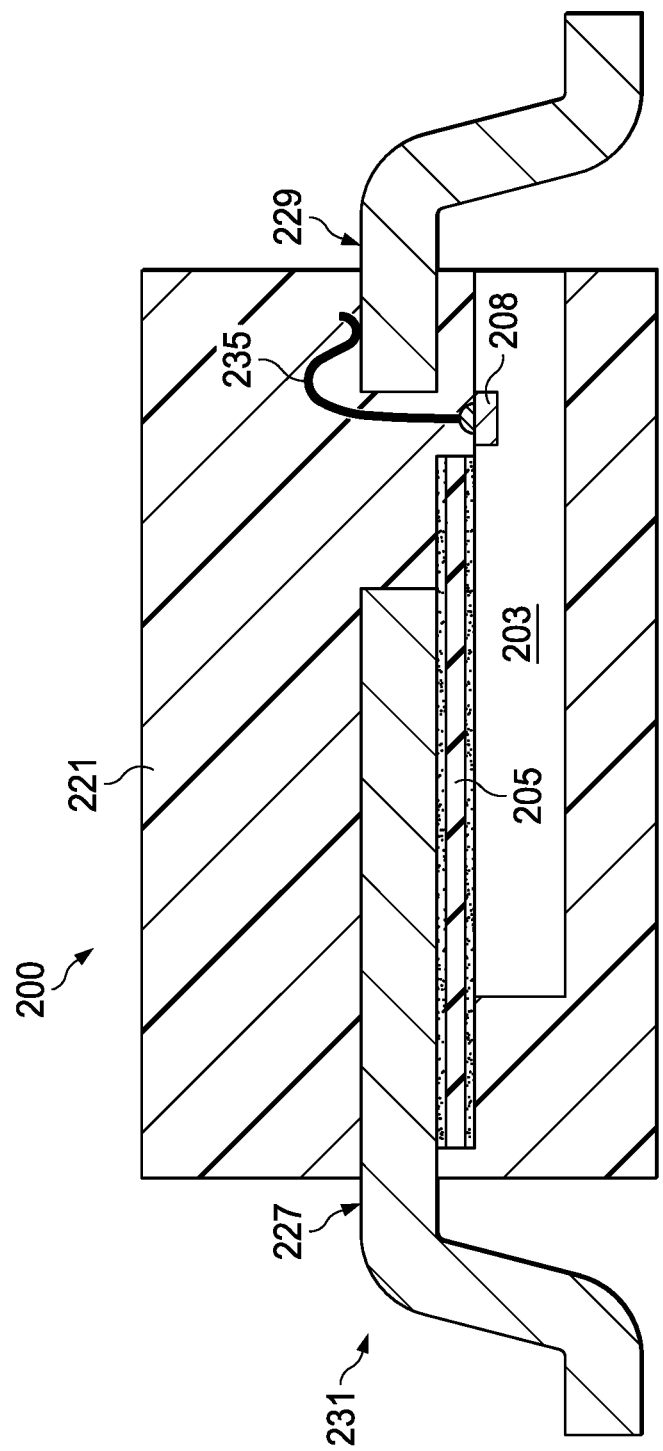
FIG. 2D is a cross section of the semiconductor device package.

FIG. 2D illustrates in a cross sectional view the semiconductor device package 200 with mold compound 221 forming a package body, and first portion 227 including leads extending from the mold compound 221, and second portion 229 of the package substrate including leads extending from the mold compound 221. The spacer dielectric 205 spaces the semiconductor die 203 from the first portion 227. The semiconductor die 203 includes a bond pad 208 and bond wire 235 couples bond pad 208 to a lead of the second portion 229 of the package substrate. The second portion 229 and the semiconductor die 203 are electrically isolated from the first portion 227 of the package substrate, which can be a metal lead frame of copper, aluminum, steel, stainless steel or alloys such as Alloy 42. The spacer dielectric 205, and the mold compound 221, are used to form an isolation barrier between the first portion 227 and the semiconductor die 203.

Figure 3A:
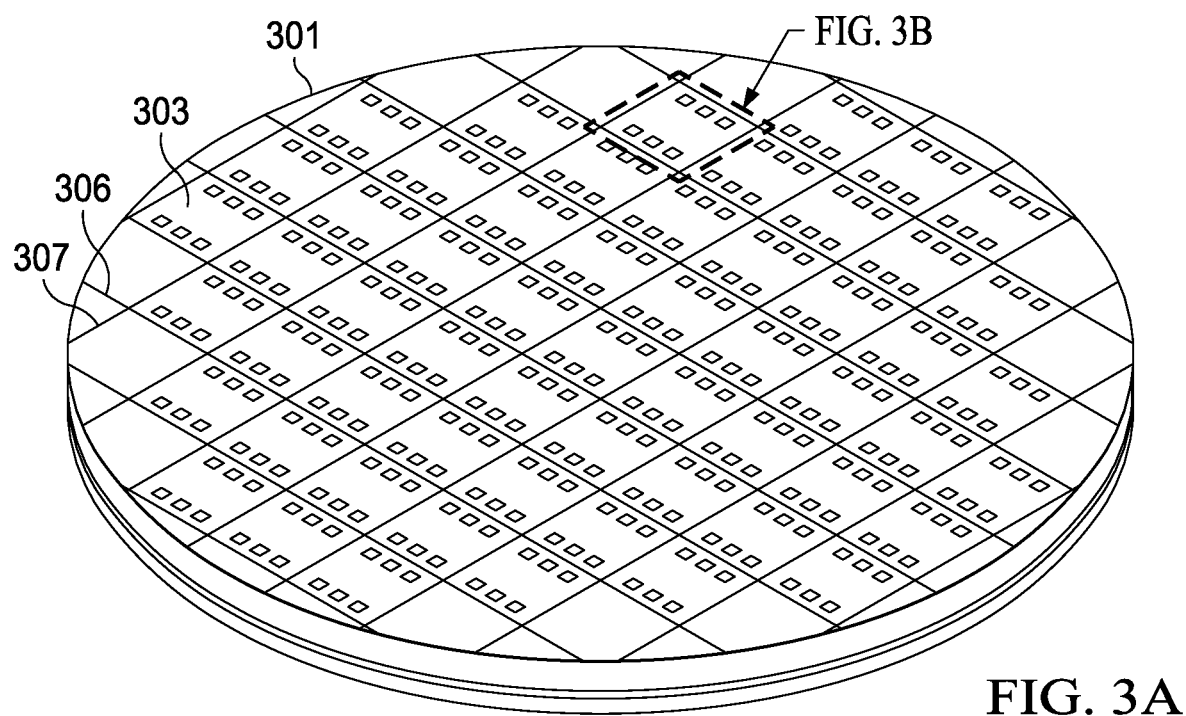
FIGS. 3A-3B illustrate in a projection view and a close up view a semiconductor wafer having semiconductor dies in rows and columns, and an individual semiconductor die for use with the arrangements.
Figure 3B:
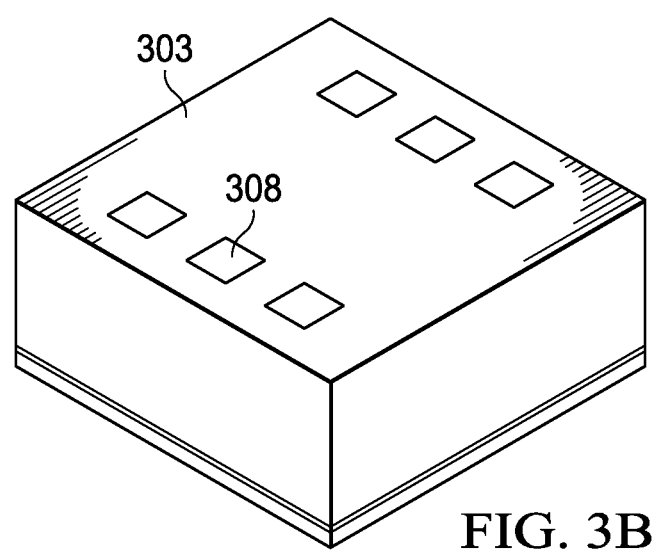

FIGS. 3A-3B illustrate, in projection views, a semiconductor wafer 301 with semiconductor dies 303 formed in rows and columns, and a unit semiconductor die 303 after it is separated from the semiconductor wafer. In FIG. 3A, the semiconductor wafer 301 has semiconductor dies 303 formed on it. Scribe lanes 306 and 307 run across the wafer 301 between the semiconductor dies 303, the scribe lines are perpendicular to one another in parallel groups. The semiconductor dies 303 can be separated from one another by mechanical sawing along the scribe lanes 306, 307, or by use of a laser to score the wafer in the scribe lanes, and breaking the semiconductor wafer 301 along the scored lines. FIG. 3B illustrates, in a close up view, a semiconductor die 303 that can be used in an arrangement. Bond pads 308 are formed on a device surface of the semiconductor die 303. The bond pads 308 are electrically coupled to circuitry (not shown) formed within semiconductor die 303.

Figure 4A:
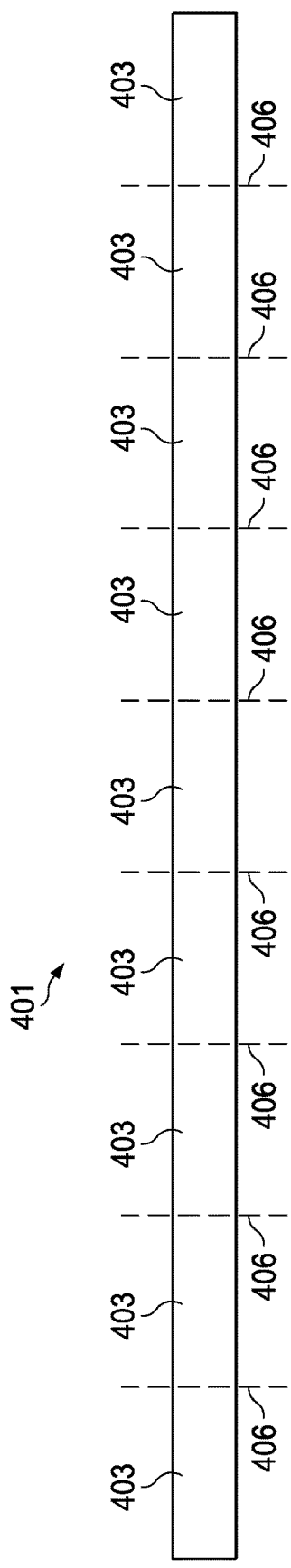

FIGS. 4A-4F illustrate, in a series of cross sections, steps for forming a semiconductor die that is used in an arrangement. In FIG. 4A, a semiconductor wafer 401 is shown in cross section, with semiconductor dies 403 formed on it, and scribe lanes 406 shown between the semiconductor dies 403. As shown in FIGS. 3A-3B, semiconductor dies can be removed from a wafer by singulation along scribe lanes, such as 406, between the dies.

Figure 4B:

FIG. 4B illustrates, in another cross sectional view, a package substrate 431, which can be a conductive lead frame, having a first portion 427 and a second portion 429. The first portion 427 and the second portion 429 include conductive leads (not visible in the cross section) that will form terminals for a completed semiconductor device package.

Figure 4C:
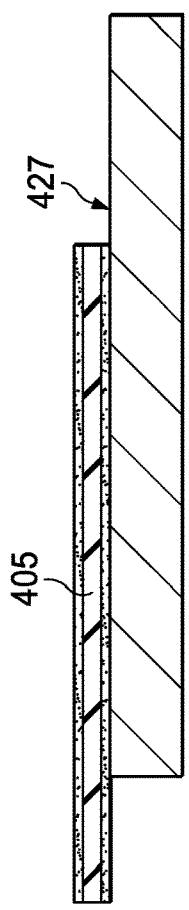
Figure 4C:
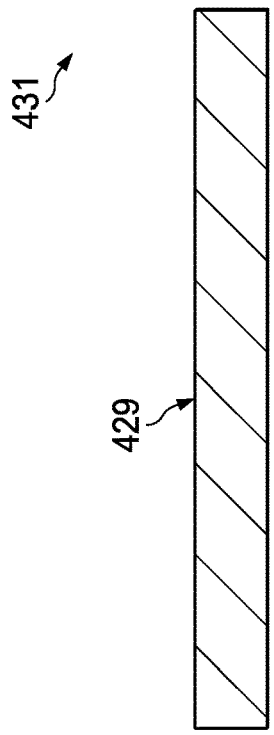

FIG. 4C is another cross section illustrating the package substrate 431 of FIG. 4B after an additional processing step. In FIG. 4C, a spacer dielectric 405 is mounted to a device side surface of the first portion 427 of the package substrate 431. The spacer dielectric 405 is an insulator and can be a printed circuit board material, such as FR4 or BT resin. In additional alternative arrangements, the spacer dielectric 405 can be a glass, plastic, fiberglass, resin, epoxy, semiconductor substrate, or other insulating material.

Figure 4D:
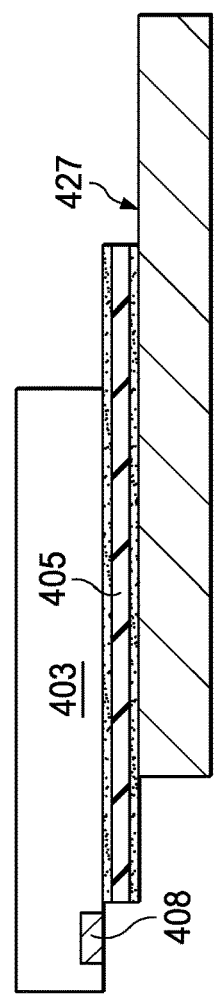
Figure 4D:
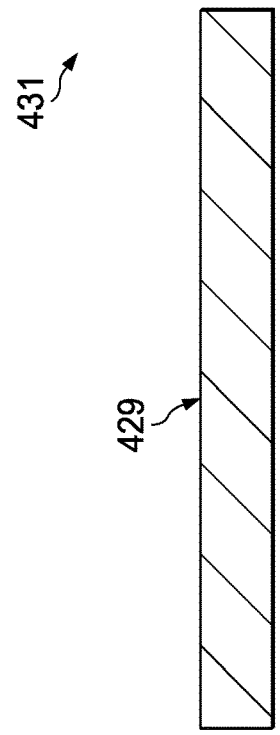

FIG. 4D is another cross section illustrating the arrangement of FIG. 4C after additional processing steps. A semiconductor die 403 from the semiconductor wafer 401 in FIG. 4A is shown mounted to the spacer dielectric 405 on a surface opposite the surface of the spacer dielectric mounted to the first portion 427, so that the spacer dielectric is positioned between the first portion 427 the package substrate 431, and the semiconductor die 403. The semiconductor die 403 is electrically isolated from the conductive first portion 427 of the package substrate 431 by the spacer dielectric 405. The semiconductor die 403 is mounted using die attach material, which can be a non-conductive die attach film, tape, paste or epoxy. The semiconductor die 403 is positioned so that a bond pad 408 on the device side surface of the semiconductor die 403 is over the space between the first portion 427 and the second portion 429, and the semiconductor die 403 is cantilevered over the space. The semiconductor die 403 is mounted on the "face" side, and may be referred to as "flip chip" mounted to the spacer dielectric 405. Bond pad 408 is positioned in the space between the first portion 427 and the second portion 429.

FIG. 4E illustrates, in another cross sectional view, the package substrate 431 of FIG. 4D after an additional processing step. In FIG. 4E, the elements are shown inverted after the process of FIG. 4D, to assist with wire bonding. A bond wire 435 extends from a bond ball on the bond pad 408 to a stitch bond on the second portion 429 of the package substrate 431. The bond wire 435 extends through the space between the first portion 427 and the second portion 429 of the package substrate 431. The bond wire 435 electrically couples the semiconductor die 403 to the second portion 429 of the package substrate 431, which can be a conductive lead frame. In an example process, a wire bonding tool has a capillary with a bond wire extending through it. A ball is formed at the end of the wire extending from the capillary by applying flame or other heat to the exposed end of the bond wire. The ball is placed on the bond pad 408 of the semiconductor die 403 and a ball bond is formed using ultrasonic, mechanical, or thermal energy, or a combination of these. As the capillary is moved away from the bond pad, the wire extends and forms an arc or curved shape. The bond wire is placed in contact with a conductive land or lead on the lead frame in the second portion 429, and a stitch bond is formed using mechanical pressure, thermal energy, ultrasonic energy or a combination of these. The bond wire is then broken or melted to complete the wire bond and the process repeats. In the semiconductor device package 400, the semiconductor die 403 is electrically isolated from the first portion 427, while the semiconductor die 403 is positioned so that a magnetic field caused by a current flowing in the first portion 427 can be sensed by a Hall element formed in the semiconductor die 403.

FIG. 4F illustrates, in another cross section, the elements shown in FIG. 4E after a molding process. In FIG. 4F, mold compound 421 covers the semiconductor die 403, the bond wire 435, the spacer dielectric 405, parts of the first portion 427 and parts of the second portion 429 of the package substrate 431. Parts of the first portion 427 and the second portion 429 are not covered and form terminals for the semiconductor device package 400. The mold compound 421 can be a thermoset epoxy resin mold compound. The mold compound 421 can be a plastic, epoxy or resin. The mold compound 421 can be formed in a block molding operation or in a unit mold by a transfer mold process. In an example process, solid mold thermoset mold compound in a puck or powder is heated to a liquid state and subsequently transferred by pressure through runners into a mold, where the package substrate 431 is placed. The liquid mold compound fills the mold and covers the semiconductor die 403, the bond wire 435, and the spacer dielectric 405, and parts of the leads that form the first portion 427 and the second portion 429 of the package substrate 431. The mold compound is allowed to cool and set and forms a solid body of a semiconductor device package 400. Room temperature mold compounds or dielectrics such as resins or liquid epoxies can be used. In a production example, strips or arrays of unit lead frames are molded simultaneously, and then the individual devices are singulated from one another by cutting through the package substrate along saw streets between the molded devices.

Figure 4G:
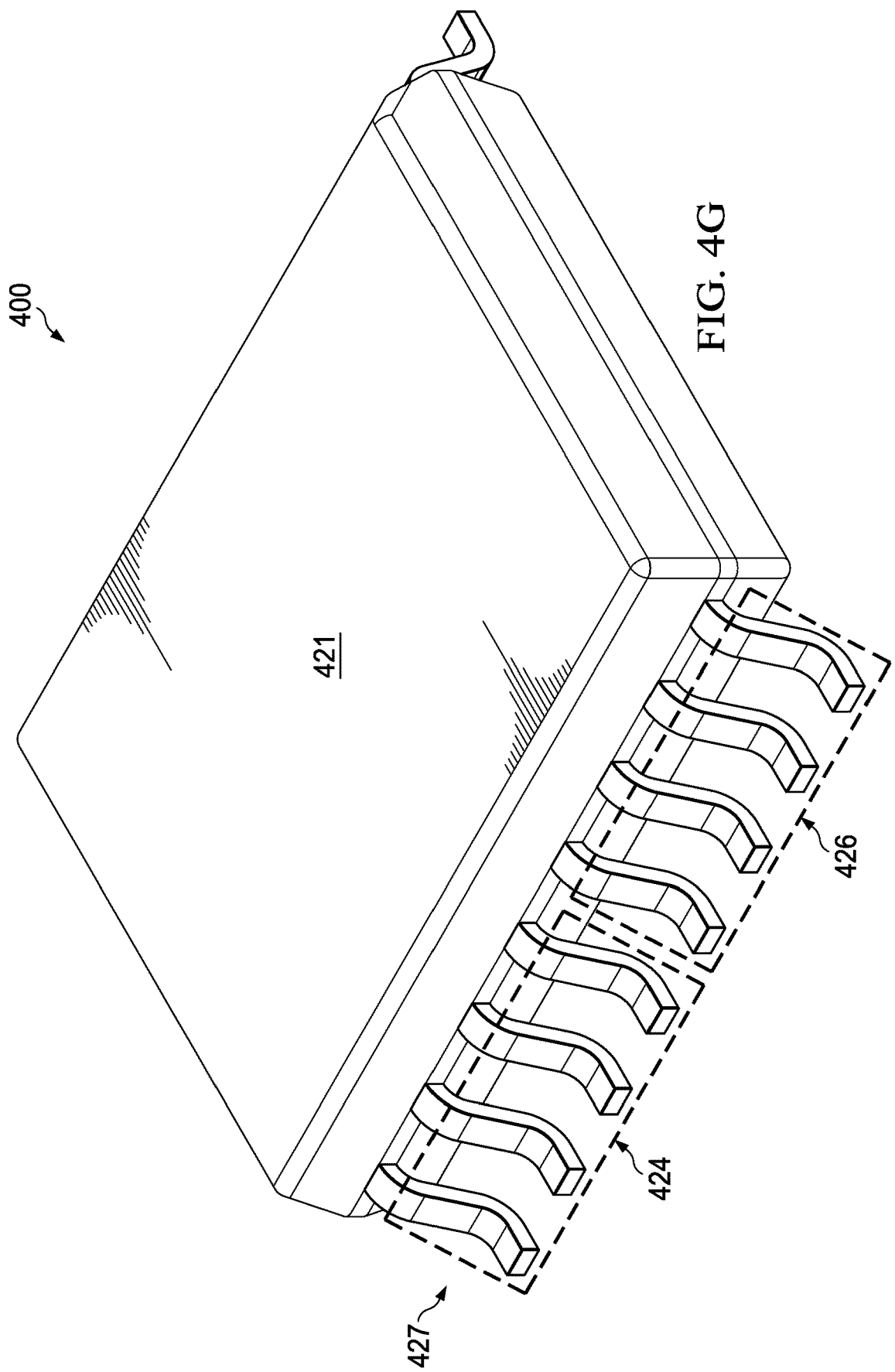
FIG. 4G illustrates in a projection view a completed semiconductor device package formed by the steps of FIGS. 4A-4F.

FIG. 4G depicts, in a projection view, the semiconductor device package 400 of FIG. 4F, after a trim and form operation completes the processing. The first portion 427 of the package substrate includes leads 424 and 426, which may be grouped to form an input IN+ and an output IN−, for example, as shown in FIG. 1. The leads 424 and 426 are trimmed to remove any supportive tie bars that connect the leads for support during the processes described above, and the leads 424 and 426 are shaped to form terminals for surface mounting the semiconductor device package 400. A "trim form" tool can be used to perform these steps. The mold compound 421 forms a package body that protects the semiconductor die 403 and the spacer dielectric 405 (see FIG. 4F).

U.S. Patent Publication No. 2021/0231729A1, titled "HIGH VOLTAGE INTEGRATED CIRCUIT TESTING INTERFACE ASSEMBLY", which is hereby incorporated by reference in its entirety herein, discloses a testing assembly for performing high voltage tests on semiconductor device packages. In the arrangements, a test handler is arranged to perform high voltage testing of semiconductor device packages.

Figure 5A:
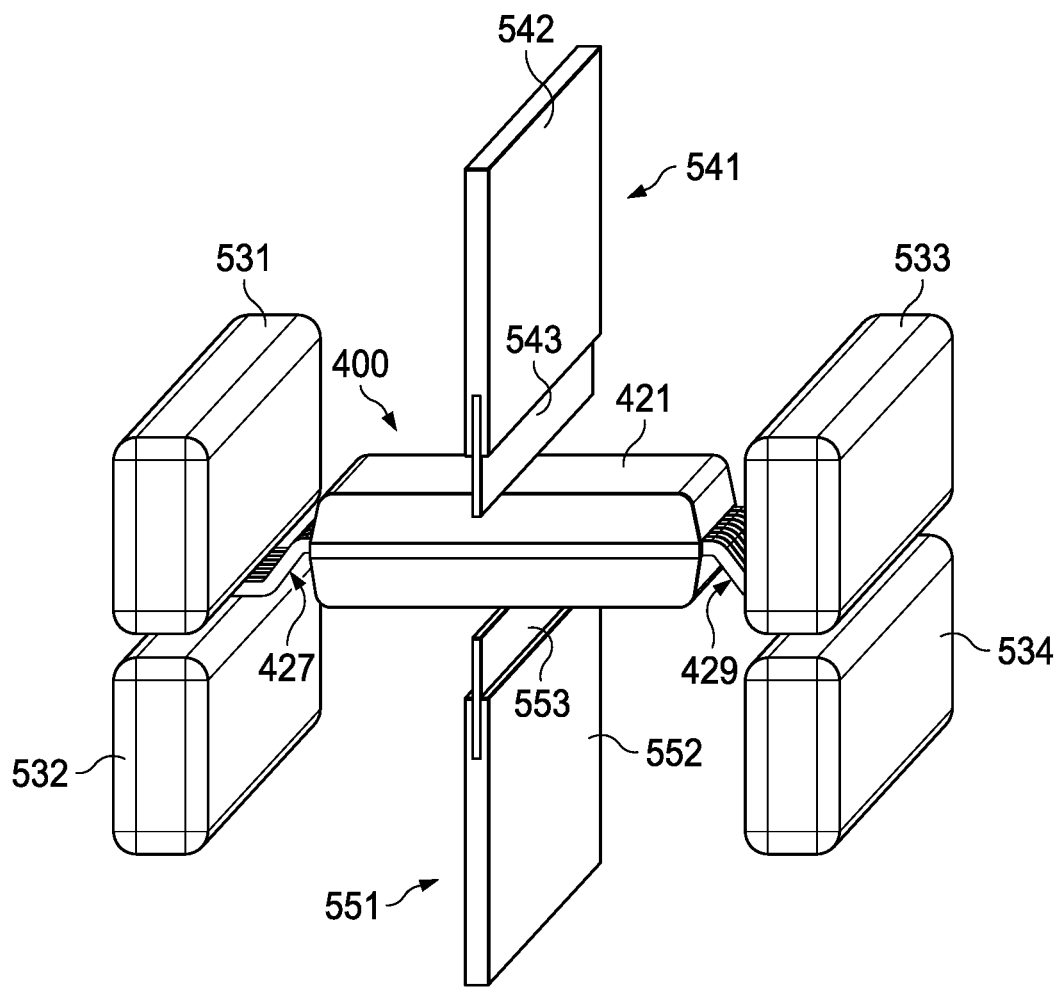
FIGS. 5A-5C illustrate, in projection views, arrangements for a test handler performing high voltage isolation tests on a semiconductor device package with isolation.
Figure 5B:
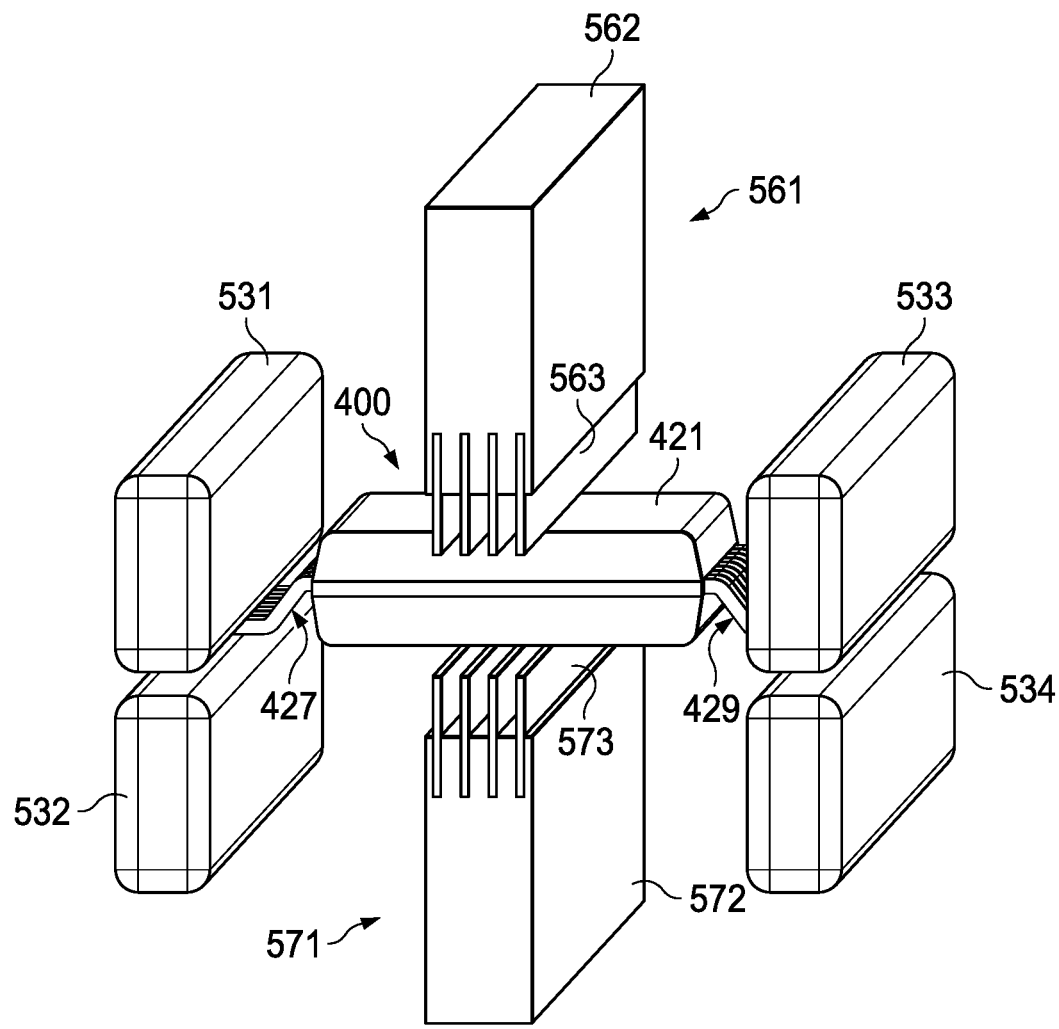
Figure 5C:
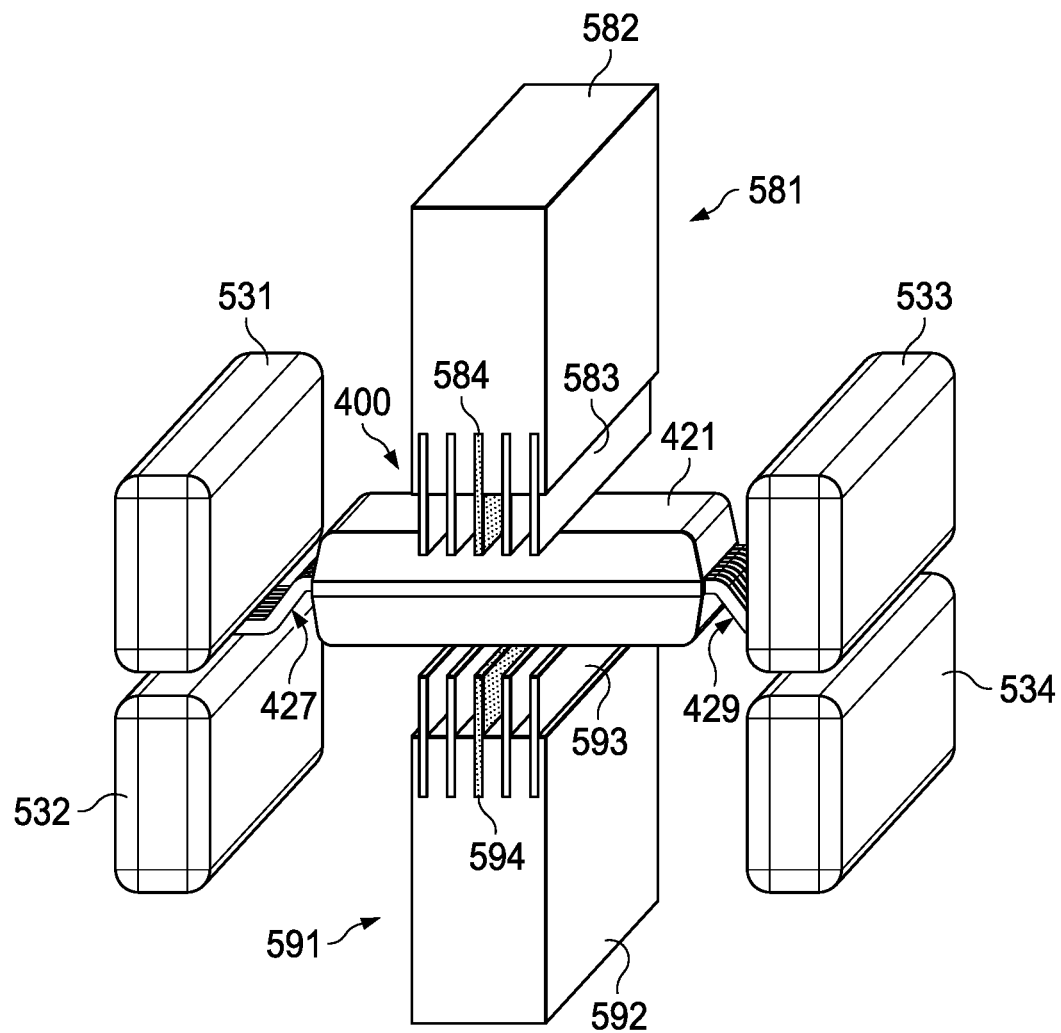

FIGS. 5A-5C illustrate, in projection views, portions of a test handler and a semiconductor device package mounted in the test handler, showing features of different arrangements. In FIG. 5A, a semiconductor device package 400 has a body of mold compound 421, and a first portion 427 of a package substrate including leads extending from the mold compound 421 to form terminals, and a second portion 429 of the package substrate including leads extending from the mold compound 421 to form additional terminals. A first conductive slug 531 and a second conductive slug 532 are positioned to make contact to both sides of the leads of the first portion 427, and a third conductive slug 533 and a fourth conductive slug 534 are positioned to make contact to both sides of the leads of the second portion 429. A first plunger 541 has a conductive blade 542 and a tip 543, the blade 542 is a conductive material such as copper or aluminum, and the tip 543 is an insulator. In example arrangements the tip 543 can be a polymer having low permittivity including polyetherimide, polyimide, silicone rubber, and/or foams of these. In an example arrangement, a plastic foam of permittivity 1.0 is used as the tip 543 with a thickness of 100 microns and a height of about 1 millimeter. The blade 542 can be a metal plate of a conductive metal such as copper, aluminum, steel, stainless steel, or alloys of these.

A second plunger 551 is shown below the semiconductor device package 400 and includes a blade 552 and a tip 553. The first plunger 541 and the second plunger 551 are arranged to moveably contact the mold compound 421 of the semiconductor device package 400 on opposing sides of the semiconductor device package 400, such as the top and the bottom surface of the semiconductor device package.

In operation the conductive slug 531 and the conductive slug 532 are coupled to conductors that place a high voltage of greater than 300 volts at the leads of the first portion 427 of the semiconductor device package 400. In an example test the high voltage is 4 kVrms, but other voltages can be used. The high voltage uses in a test arrangement is chosen to exceed by a safety margin a rated voltage for the device, the rated voltage corresponding to a voltage that will be used in the field. The plate 542 of the first plunger 541 and the plate 552 of the second plunger 551 are placed at a voltage that is approximately ½ of the high voltage, for example 2 kVrms. The third conductive slug 533 and the fourth conductive slug 534 are placed at ground. Because the conductive plates 542 and 552 are at a mid-point voltage between the high voltage and ground, and because the conductive plates 542, 552 are in the middle of the semiconductor device package 400 and between the first and second conductive slugs 531, 532 and the third and fourth conductive slugs 533, 534, the electric field concentration due to the high voltage at the first and second conductive slugs is distributed and high electric field concentrations are reduced or eliminated, preventing arcing in the air around the semiconductor device package during a high voltage test. The high voltage test is used to confirm that the first portion 427 of the semiconductor device package 400 and the second portion 429 of the semiconductor device package 400 are electrically isolated at the voltages the semiconductor device package is rated for.

Use of the arrangements prevents arcing in air due to high concentrations of the electric field between the conductive slugs 531, 532 which are at high voltage, and the conductive slugs 533, 534, which are at ground. When the high voltage test is conducted, a good semiconductor device package will not pass current between the first portion 427 of the package substrate and the second portion 429 of the package substrate, which can be confirmed by measuring current between the conductive slugs. If current is detected at a predetermined high voltage that is greater than a rated voltage for the device, then the isolation is not sufficient for the device under test, that is, the device fails the high voltage test. Typically the high voltage will be greater than a desired rated voltage by a ratio of 1.3 to 1.5 times. For a particular example, the high voltage test uses a test voltage of 4 kVrms. If arcing were to occurs across the slugs in the high voltage test handler during testing, arc current may erroneously appear as current flow between the isolated portions of the semiconductor device package and cause an improper test result. Use of the arrangements prevents or reduces the arcing due to the high field concentrations in the tester and within the semiconductor device package. In one example, the polymer tips 543, 553 in FIG. 5A are a plastic foam with a permittivity of about 1.0. In an additional example arrangement, the polymer tips 543, 553 are a silicone rubber with a permittivity of about 3.2.

FIG. 5B illustrates in a projection view an alternative arrangement for testing an isolated semiconductor device package. In FIG. 5B, semiconductor device package 400 is shown with mold compound 421 forming a body, and leads of the first portion 427 and the second portion 429 of the package substrate extending from the mold compound 421. The first and second conductive slugs 531 and 532 contact the leads of the first portion 427, while the third and fourth slugs 533 and 534 contact the leads of the second portion 429. Plunger 561 contacts the top of the semiconductor device package 400 while plunger 571 contacts the bottom of the semiconductor device package, the plungers 561 and 571 are positioned in the opening between the slugs 531, 532 and the slugs 533, 534. The plunger 561 that contacts the top of the semiconductor device package 400 (as oriented in FIG. 5B) includes several conductive plates or blades, each with a polymeric tip that contacts mold compound 421, in an example arrangement the tips are of a plastic foam. In additional useful examples, the polymeric tips can be of low permittivity material; including polyetherimide, polyimide, silicone rubber, and/or their foams. In the illustrated arrangement of FIG. 5B, the plunger 571 contacts the bottom of the mold compound 421 of the semiconductor device package 400 also has four tips 573, and four corresponding blades or plates of a conductor material 572 that are coupled together. The plungers 561 and 571 can have blades of copper, copper alloy, steel, stainless steel aluminum, or alloys of these. The tips can have a thickness of about 100 microns, and a height of about 1 millimeter, for example. The plungers contact the mold compound. The plungers can have varying dimensions, in an example the plungers can have a height and width of several millimeters, and a thickness of about 100 microns or more. A slot or notch in the blades can hold the polymeric tips in the plungers.

FIG. 5C illustrates in a projection view another alternative arrangement for testing an isolated semiconductor device package. In FIG. 5C, semiconductor device package 400 is again shown with mold compound 421 forming a body, and leads of the first portion 427 and the second portion 429 of the package substrate extending from the mold compound 421. The first and second conductive slugs 531 and 532 contact the leads of the first portion 427, while the third and fourth slugs 533 and 534 contact the leads of the second portion 429. Plunger 581 contacts the top of the semiconductor device package 400 while plunger 591 contacts the bottom of the semiconductor device package, the plungers 581 and 591 are positioned in the opening between the slugs 531, 532 and the slugs 533, 534. The plunger 581 that contacts the top of the semiconductor device package 400 (as oriented in FIG. 5B) includes several conductive plates or blades, with a polymeric tip that contacts mold compound 421, in an example arrangement the tips are of a plastic foam. In addition, the tips include a conductive tip 584. In additional useful examples, the polymeric tips can be of low permittivity material; including polyetherimide, polyimide, silicone rubber, and/or their foams. In the illustrated arrangement of FIG. 5C, the plunger 591 contacts the bottom of the mold compound 421 of the semiconductor device package 400 also has four tips 593, and corresponding blades or plates of a conductor material 572 that are coupled together. In addition the plunger 592 has a conductive tip 594, the conductive tip can be of copper, aluminum or another conductor. The tips can have a thickness of about 100 microns, and a height of about 1 millimeter, for example. The tips of the plungers contact the mold compound.

In a high voltage isolation test, a high voltage of greater than 300 volts is applied to the first slug 531 and second slug 532 while the slugs are in contact with the leads of the first portion 427. During the high voltage test the third slug and fourth slug 533, 534 contacting the leads of the second portion 429 of the semiconductor device package 400 are at ground, and the conductive blades or plates 582, 592 of the plungers 581, 591 are at approximately half the high voltage. By applying a voltage of about half the high voltage to the plungers in contact with the semiconductor device package during the high voltage isolation tests, the electric field is distributed around the semiconductor device package 400 in the test handler, and high electric field concentrations are avoided. Arcing that can occur between the slugs at the high voltage and the slugs at ground due to dielectric breakdown is prevented.

Figure 5D:
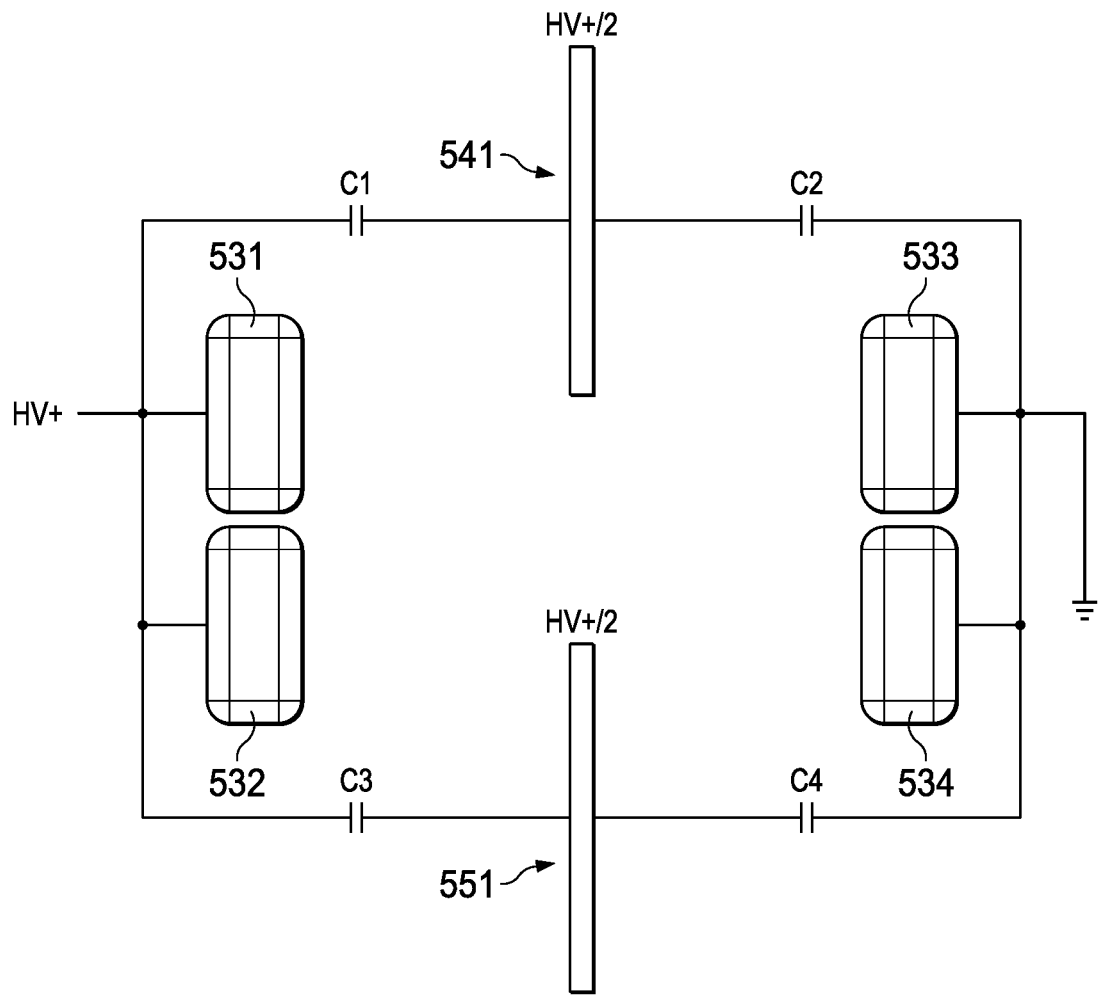
FIG. 5D illustrates a circuit diagram for applying voltages to the arrangements.

FIG. 5D illustrates in an electric circuit diagram one circuit for an arrangement for a test handler. In FIG. 5D, the first conductive slug 531 and the second conductive slug 532 are coupled to a high voltage HV+, which can be coupled to a high voltage of 300 volts, or higher, such as 1 kV, 2 kV etc. In an example test, a high voltage of 4 kVrms is used. The third conductive slug 533 and the fourth conductive slug 534 is coupled to ground.

In the arrangements, a voltage of HV+/2, or approximately half the high voltage, is applied to the plunger 541, which is arranged to contact the top surface of a semiconductor device package as shown in FIGS. 5A-5C, and to the plunger 551, which is arranged to contact the bottom surface of a semiconductor device package as shown in FIGS. 5A-5C. In the illustrated example, the voltages are divided using a capacitive voltage divider. The plunger 541 is coupled to the first capacitor C1, and to the second capacitor C2, while the plunger 551 is coupled to the third capacitor C3, and the fourth capacitor C4. By making the capacitance of each of the capacitors C1-C4 the same, the high voltage HV+ will be divided in half at the node between the capacitors, where the plungers 541, 551 are coupled. Other circuitry that supplies a voltage corresponding to half of the high voltage HV+ to the plungers can be used to from additional arrangements.

Figure 5E:
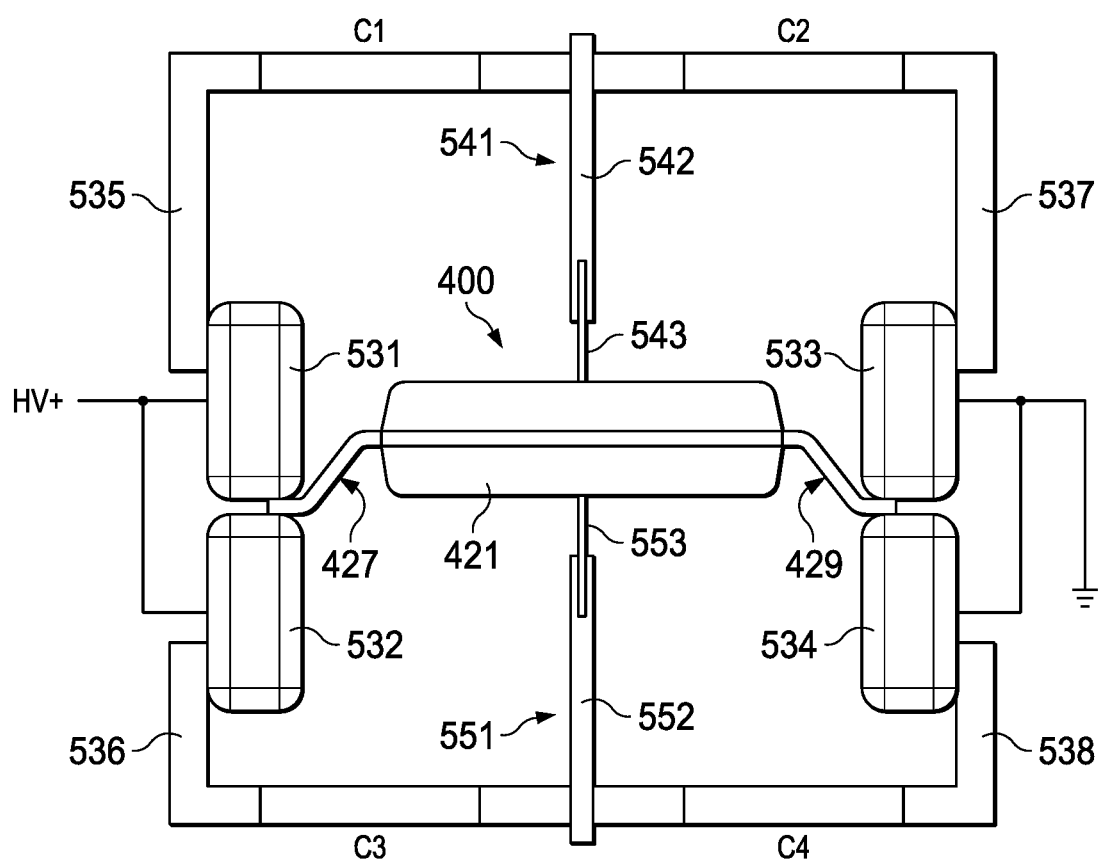
FIG. 5E illustrates, in a cross sectional view, additional details of an arrangement.

FIG. 5E illustrates in an example arrangement a voltage divider adapted for use in a test handler to provide the HV+/2 voltage to the plungers 541, 551. First conductive slug 531 and second conductive slug 532 are coupled to a high voltage input labeled HV+ for receiving the high voltage during a test. A semiconductor device package 400 is shown in the test handler with the first conductive slug 531 and second conductive slug 532 in contact with the leads of a first portion 427 of the lead frame of the semiconductor device package 400. The leads of the second portion 429 of the lead frame of the semiconductor device package 400 is contacted by the third conductive slug 533 and the fourth conductive slug 524 which are coupled to an input that can be coupled to ground or a voltage reference. A first frame 535 carries a capacitor C1 that is coupled between the first conductive slug 531 and the conductive plate 542 of the first plunger 541. A second frame 537 carries a second capacitor C2 that is coupled between the conductive plate 542 of the first plunger 541 and the third conductive slug 533. A third frame 536 carries a capacitor C3 that is coupled between the second conductive slug 532 and the conductive plate 552 of the second plunger 551. A fourth frame 538 carries a fourth capacitor C4 that is coupled between the conductive plate 552 of the second plunger 552 and the fourth conductive slug 534. The capacitors C1 and C2 divide the voltage at the first conductive slug 531 in half and that voltage (approximately HV+/2) is coupled to the first plunger 541. The first and second frames 535, 537 carry the capacitors C1, C2, the first conductive slug 531, the third conductive slug 533, and the first plunger 542, and can be moved together to allow the semiconductor device package 400 to be loaded into the test handler and to be removed from the test handler. The third and fourth frames 536, 538 carry capacitors C3, C4, the second conductive slug 532, the fourth conductive slug 534, the second plunger 552, and these frames and the other elements mounted to them can also be moved together to allow the semiconductor device package 400 to be loaded into the test handler and removed from the test handler. The capacitors C3 and C4 divide the voltage HV+ at the second conductive slug 532 in half and that voltage (HV+/2) is coupled to the second plunger 551. The frames 535, 537, 536, 538 can be of a conductive metal, such as copper or stainless steel, and can couple the capacitors as described above, alternatively wiring can be used to couple the capacitors as described above, and the frames can be made of any material of sufficient strength. The frames of the test handler can move to allow the semiconductor device package 400 to be mounted between the conductive slugs and then the conductive slugs can be placed in contact with the leads of the lead frame, as shown in the figures, with the tips 543 and 553 of the first plunger 541 and the second plunger 552 in contact with the mold compound 421, During the high voltage test, the voltage HV+/2 is coupled to the conductive plates 542, 552, of the plungers, distributing the electric field over the semiconductor device package 400, avoiding high field concentrations and arcing that might otherwise occur when the electric field breaks down in the air between the elements.

Figures 6A, 6B:
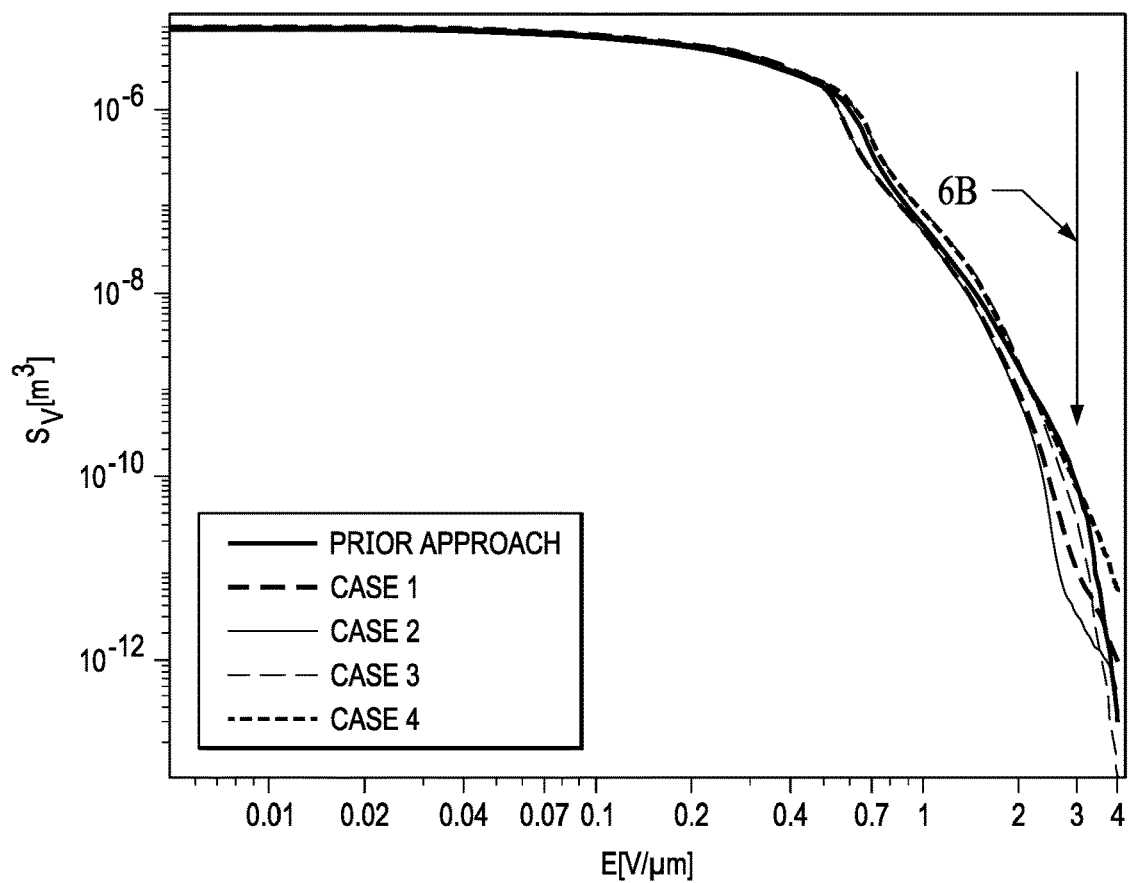
FIG. 6A illustrates a graph.
FIG. 6B illustrates in a corresponding table of values taken at a point on the graph, stress volume results for a simulation illustrating a high voltage test performed without use of the arrangements and comparing results obtained for the stress volume for tests performed using different arrangements.

FIG. 6A illustrates in a graph, and FIG. 6B illustrates in a corresponding table, simulation results from a finite element analysis simulator showing a stress volume $S_v$ in cubic meters cubed[$m^3$] obtained for different arrangements and compared to a test handler without use of the arrangements. FIG. 6A is a graph with the stress volume $S_v$ on the vertical scale, and the electric field E shown in volts per micron [V/μm] on the horizontal scale. The plot labeled "Prior Approach" corresponds to a test handler without the use of the arrangements, the Case 1 plot corresponds to a single blade plunger (such as in FIG. 5A) with a silicone rubber insulating tip, the Case 2 plot corresponds to a single blade plunger (as in FIG. 5A) with the polymer foam tip, Case 3 corresponds to the plunger with four blades with insulating tips (as in FIG. 5B), and Case 4 corresponds to four insulating blades and a metal blade (as in FIG. 5C). The arrow indicates a point on the horizontal axis where the E field is 3 Wpm. Data taken at this point is shown in the table of FIG. 6B.

In FIG. 6B, the table shows the stress volume $S_v$ for the plots in FIG. 6A at the point (see the downwards arrow in FIG. 6A) where the electric field E is 3V/μm. In the first row labeled "Prior Approach", without use of the arrangements, a test handler of a prior approach had a stress volume $S_v$ of 75.59. In the table, the second row labeled "Case 1—single blade, permittivity 3.2" illustrates an arrangement of FIG. 5A with the silicone rubber tip material, with a stress volume Sv of 9.43, an improvement over the prior approach. In the third row, labeled "Case 2 single blade with polymer, permittivity 1.0", illustrates an arrangement such as in FIG. 5A where the single blade insulating tipis of a plastic foam with low permittivity. The stress volume Sv obtained was 2.94, the best performance for an arrangement. The remaining rows, Case 3, and Case 4, illustrate the performance of the arrangements of FIGS. 5B, multiple tips on multiple blades, and 5C, multiple blades with tips of a permittivity 2.1 with a conductive tip in contact with the mold compound of the semiconductor package. These arrangements improved the stress volume Sv over the prior approach, but to a lesser extent than that of the single blade arrangements of Case 1 and Case 2. The arrangement of FIG. 5A, with a single blade and a single polymeric tip of a plastic foam with a permittivity of about 1.0, is preferred among the illustrated arrangements and as shown in the Table of FIG. 6B, increases performance by a substantial amount, a decrease of about 96% over the prior approach. However, each of the illustrated examples improved the performance over the prior approach.

Figure 7A:
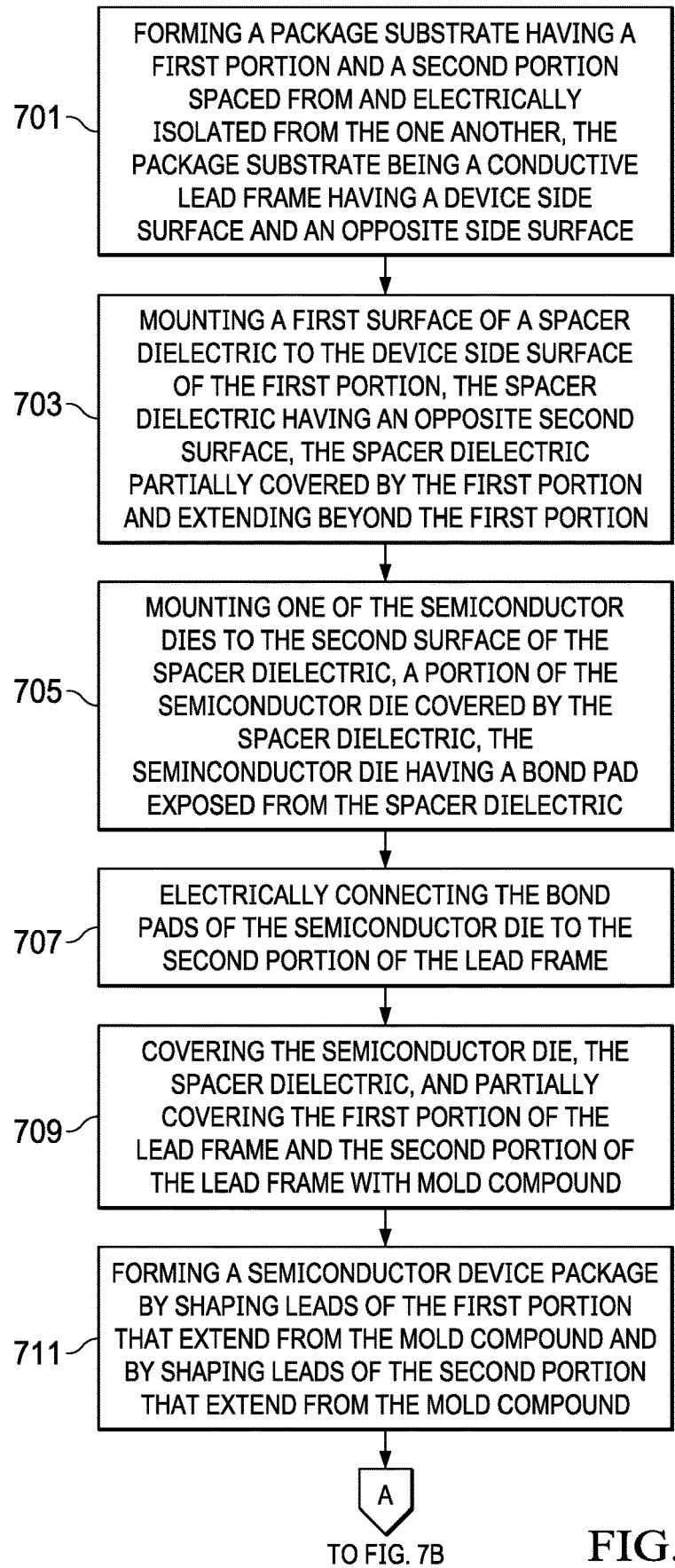
FIGS. 7A-7B illustrate, in a flow diagram, steps for a method arrangement.
Figure 7B:
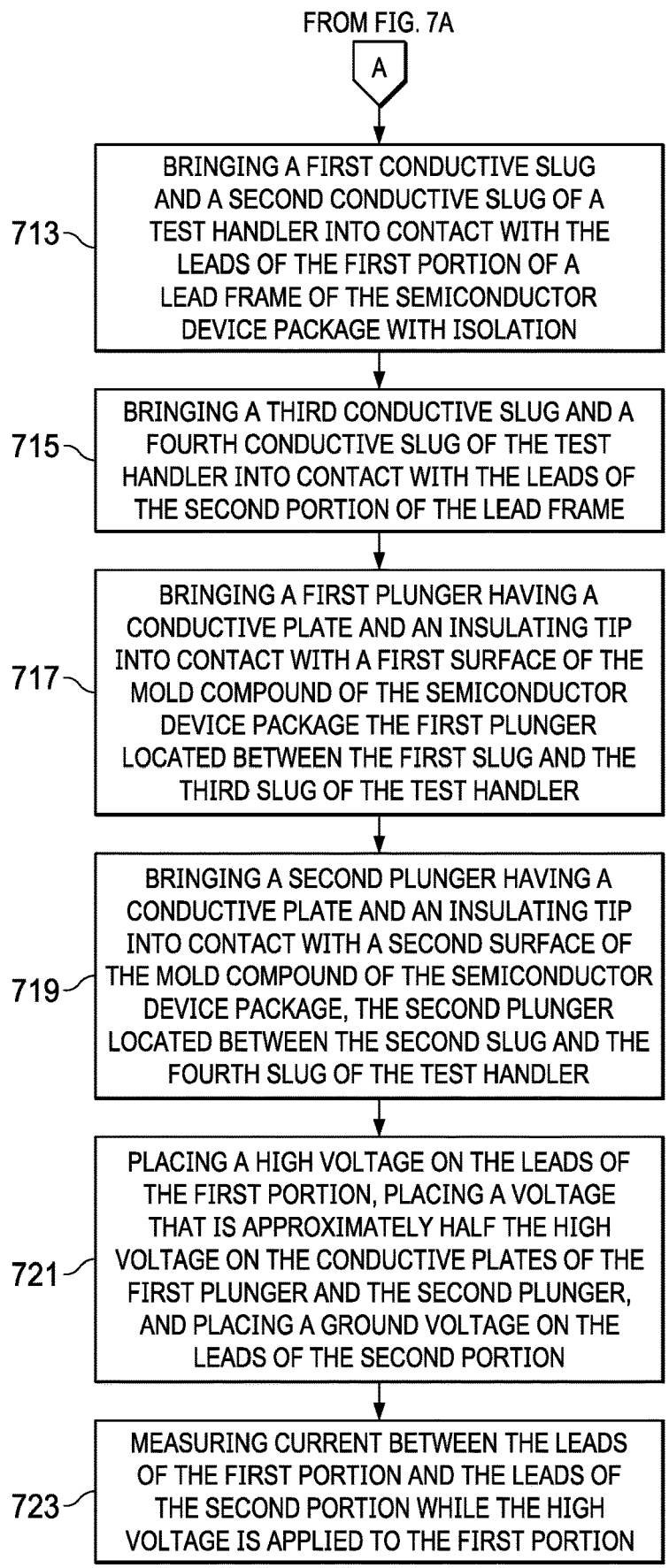

FIGS. 7A-7B illustrate, in flow diagrams, a method arrangement for manufacturing a semiconductor device. At step 701, a package substrate, which can be a conductive lead frame, is formed having a first portion and a second portion spaced from and electrically isolated from one another, the lead frame having a first device side surface and an opposite side surface (see first portion 427 and second portion 429 in FIG. 4B).

At step 703, the first surface of a spacer dielectric is mounted to the device side surface of the first portion, the spacer dielectric having the first surface and an opposite second surface, the spacer dielectric partially covered by the first portion and extending beyond the first portion (see spacer dielectric 405 in FIG. 4C).

At step 705, a semiconductor die is mounted to the second surface of the spacer dielectric, a portion of the semiconductor die is covered by the spacer dielectric, and the semiconductor die having a bond pad exposed from the spacer dielectric (see semiconductor die 403 in FIG. 4D, with bond pad 408).

At step 707, electrical connections are made between the bond pad of the semiconductor die and the second portion of the lead frame (see bond wire 435 in FIG. 4E). Alternative electrical connections include ribbon bonding.

At step 709, mold compound is used to cover the semiconductor die, the spacer dielectric, and partially cover the first portion of the lead frame and the second portion of the lead frame to form a semiconductor device package (see mold compound 421 in FIG. 4F, semiconductor device package 400 in FIG. 4G).

At step 711, the leads of the first portion the leads of the second portion are shaped and any connecting material is removed to complete the semiconductor device package (see semiconductor device package 400 in FIG. 4G).

The method continues in FIG. 7B. The steps shown in FIG. 7A can be performed asynchronously with the test method steps of FIG. 7B, the semiconductor device package can be manufactured at any time and place, and then the test methods of FIG. 7B can be performed to complete the method arrangement.

At step 713, the first conductive slug and the second conductive slug of a test handler are brought into contact with the leads of the first portion of a lead frame of the semiconductor device package with isolation (see conductive slugs 531, 532 in FIG. 5E for example).

At step 715, the third conductive slug and a fourth conductive slug of the test handler are brought into contact with the leads of the second portion of the lead frame. Note that while these are described as separate, sequential steps for ease of explanation, the test handler can perform these steps, as well as steps 717 and 719 below, contemporaneously as well.

At step 717, the first plunger having a conductive plate and an insulating tip is brought into contact with the first surface of the mold compound of the semiconductor device package. The first plunger is between the first slug and the third slug, in the space between the conductive slugs of the test handler. In an example as shown in FIG. 5E, the first plunger 542 contact the top surface of the mold compound 421, and is placed at the midpoint between the conductive slugs 531, 533.

At step 719, a second plunger having a conductive plate and an insulating tip is brought into contact with the second surface of the mold compound of the semiconductor device package, the second plunger located between the second slug and the fourth slug of the test handler. The second plunger, in the example shown in FIG. 5E, is placed opposite the first plunger and is beneath the semiconductor device package, and contacts the bottom surface of the mold compound 421.

At step 721, a high voltage is placed on the leads of the first portion, a voltage that is approximately half the high voltage is placed on the conductive plates of the first plunger and the second plunger, and leads of the second portion are placed at a ground voltage. At step 723, a test is performed by measuring current between the leads of the first portion, where the first and second slugs are contacting the leads at the high voltage, and the leads of the second portion, where the third and fourth conductive slugs are contacting the leads at a ground voltage. If the current is less than a predetermined threshold, which is set to a low or zero current level, the isolation in the semiconductor device package is sufficient and an indication is made that the semiconductor device package passed the high voltage isolation test. If in contrast the current flowing exceed the predetermined level, the isolation of the semiconductor device package is not sufficient, and an indication is made that the semiconductor device package has failed the high voltage isolation test. Failed devices should be identified and scrapped, or repaired.

In example arrangements, semiconductor devices are manufactured including a semiconductor device package with isolated portions in a package substrate, such as a lead frame. The electrical isolation is then tested. In a test handler, a high voltage greater than 300 volts, and up to several kilovolts, is placed on a first portion of the lead frame. Plungers that have conductive plates and insulating tips are placed in contact with the mold compound of the semiconductor device package. In the arrangements, the plungers are placed at a voltage that is divided from the high voltage and is approximately half the high voltage at the first portion. A ground voltage is placed on leads of the second portion of the lead frame. The use of the arrangements, and the divided voltage on the plungers that contact the mold compound of the semiconductor device package, distributes the electric field in the test handler due to the high voltage, preventing arcing in the air and reducing current due to the arcing that might otherwise occur. Structures are used within the test handler to curtail high concentrations of an electric field in an isolated device package. In an example arrangement, a capacitor dividing structure is used to divide the high voltage at to a divided voltage that is half the high voltage, and the divided voltage is coupled to the conductive plates of the plungers Use of the structures of the arrangements in a test handler for performing a high voltage isolation test of a semiconductor device package reduces the concentration of an electric field that occurs when the first portion of the lead frame is coupled to a high voltage.

Modifications are possible in the described arrangements, and other alternative arrangements are possible within the scope of the claims.

What is claimed is:

1. A method for testing isolation in a semiconductor device package, comprising:
   placing a semiconductor device package in a test handler, the semiconductor device package having first leads of a first portion of a package substrate extending from a mold compound forming a package body of the semiconductor device package and having second leads of a second portion of the package substrate extending from the mold compound, the first portion electrically isolated from the second portion;
   contacting the first leads of the first portion with a first conductive slug and a second conductive slug of the test handler;
   contacting the second leads of the second portion with a third conductive slug and a fourth conductive slug of the test handler, the third conductive slug and the fourth conductive slug spaced from the first conductive slug and the second conductive slug;
   contacting a first surface of the mold compound with a first plunger having a conductive plate and an insulating tip, the insulating tip in contact with the first surface of the mold compound;
   contacting a second surface of the mold compound opposite the first surface of the mold compound with a second plunger, the second plunger having a conductive plate and an insulating tip, the insulating tip in contact with the second surface of the mold compound; and
   placing a high voltage on the first conductive slug and the second conductive slug, while placing approximately half the high voltage on the conductive plate of the first plunger and on the conductive plate of the second plunger, and while placing a ground voltage on the third conductive slug and the fourth conductive slug.

2. The method of claim 1, wherein placing approximately half the high voltage on the conductive plate of the first plunger further comprises:
   coupling a first capacitor having a first capacitance between the first conductive slug of the test handler and the conductive plate of the first plunger; and
   coupling a second capacitor having the first capacitance between the conductive plate of the first plunger and the third conductive slug of the test handler.

3. The method of claim 1, and further comprising:
   measuring a current between the first conductive slug and the third conductive slug while the high voltage is coupled to the first conductive slug.

4. The method of claim 3, wherein responsive to determining the current is greater than a predetermined threshold, indicating the semiconductor device package as failing a high voltage isolation test.

5. The method of claim 3, wherein responsive to determining the current is less than a predetermined threshold, indicating the semiconductor device package as passing a high voltage isolation test.

6. A method for forming a semiconductor device, comprising:
- forming semiconductor dies on a semiconductor wafer;
- forming a package substrate comprising a first portion and a second portion spaced from and electrically isolated from the first portion, the package substrate comprising a conductive lead frame, the first portion having a device side surface and an opposite surface;
- mounting a first surface of a spacer dielectric having the first surface and a second surface opposite the first surface to the device side surface of the first portion of the package substrate, the spacer dielectric partially covered by the first portion, and extending beyond the first portion;
- mounting one of the semiconductor dies to the second surface of the spacer dielectric, the one of the semiconductor dies partially covered by the spacer dielectric and having a bond pad formed on a surface of the semiconductor die that extends beyond the spacer dielectric;
- coupling the bond pad of the semiconductor die by making an electrical connection from the bond pad to a lead that is formed of the second portion of the lead frame;
- covering the semiconductor die, the electrical connection, the spacer dielectric, and partially covering the first portion of the lead frame and partially covering the second portion of the lead frame in a mold compound;
- forming a semiconductor device package by shaping first leads of the first portion that extend from the mold compound and by shaping second leads of the second portion that extend from the mold compound;
- bringing a first conductive slug and a second conductive slug of a test handler into contact with the first leads of the first portion;
- bringing a third conductive slug and a fourth conductive slug of the test handler into contact with the second leads of the second portion;
- bringing a first plunger having a conductive plate and an insulating tip into contact with a first surface of the mold compound of the semiconductor device package, the first plunger located between the first slug and the third slug of the test handler;
- bringing a second plunger having a conductive plate and an insulating tip into contact with a second surface of the mold compound of the semiconductor device package on a side opposite the first surface of the mold compound, the second plunger placed opposite the first plunger and between the second slug and the fourth slug of the test handler; and
- placing a high voltage on the first leads of the first portion, placing a voltage that is approximately half the high voltage on the conductive plate of the first plunger and on the conductive plate of the second plunger, and placing a ground voltage on the second leads of the second portion.

7. The method of claim 6, and further comprising:
- measuring a current between the first portion and the second portion of the package substrate.

8. The method of claim 7, wherein responsive to determining that the current is greater than a predetermined threshold, indicating that the semiconductor device failed a high voltage isolation test; and
- wherein responsive to determining that the current is less than the predetermined threshold, indicating the semiconductor device package passed a high voltage isolation test.

9. The method of claim 6, wherein placing the first plunger at the voltage that is approximately half the high voltage further comprises:
- coupling a first capacitor having a first capacitance in series between the first conductive slug of the test handler and the conductive plate of the first plunger, and
- coupling a second capacitor of the first capacitance in series between the conductive plate of the first plunger and the third conductive slug of the test handler.

10. The method of claim 9, and further comprising:
- coupling a third capacitor having the first capacitance in series between the second conductive slug of the test handler and the conductive plate of the second plunger, and
- coupling a fourth capacitor having the first capacitance in series between the conductive plate of the second plunger and the fourth conductive slug of the test handler.

11. The method of claim 6, wherein the high voltage is greater than 300 volts.

12. The method of claim 6, wherein the high voltage is greater than 1 kilovolt.

13. The method of claim 6 wherein bringing a first plunger having a conductive plate and an insulating tip into contact with a first surface of the mold compound further comprises bringing a first plunger comprising a conductive plate of copper, aluminum, steel, stainless steel or alloys thereof and having an insulating tip that comprises polyetherimide, polyimide, silicone rubber, plastic or foams of one of these into contact with the first surface of the mold compound.

14. The method of claim 13, wherein bringing a first plunger having a conductive plate and an insulating tip into contact with a first surface of the mold compound further comprises bringing more than one insulating tips of a first plunger having several conductive plates with insulating tips connected in parallel into contact with the first surface of the mold compound.

15. The method of claim 13, wherein bringing a first plunger having several conductive plates with insulating tips in parallel into contact with the first surface of the mold compound further comprises bringing a first plunger having several conductive plates with insulating tips in parallel and having a conductive tip in parallel with the insulating tips into contact with the first surface of the mold compound.

16. The method of claim 6, wherein forming semiconductor dies further comprises forming semiconductor dies including a Hall element.

17. The method of claim 16, wherein forming semiconductor dies including a Hall element further comprises forming semiconductor dies including circuitry configured to sense current using the Hall element.

18. The method of claim 6, wherein mounting the semiconductor die to the spacer dielectric further comprises electrically isolating the semiconductor die from the first portion of the lead frame, while positioning the semiconductor die to be exposed to a magnetic field that corresponds to a current flowing in the first portion of the lead frame.

19. An test handler for performing a high voltage isolation test on a semiconductor device package, comprising:
- a first conductive slug and a second conductive slug configured to contact first leads of a first portion of a package substrate of the semiconductor device package, the first conductive slug and the second conductive slug configured to be coupled to a high voltage;
- a third conductive slug and a fourth conductive slug configured to contact the second leads of a second portion of the package substrate of the semiconductor device package, the third conductive slug and the fourth conductive slug configured to be coupled to a ground voltage;

a first plunger configured to contact a first surface of a mold compound forming the body of the semiconductor device package the first plunger including a conductive plate and an insulating tip arranged to contact the first surface of the mold compound, the conductive plate configured to be coupled to a voltage that is approximately one half the high voltage; and a second plunger configured to contact a second surface of the mold compound opposite the first surface of the mold compound, the second plunger including a conductive plate and an insulating tip arranged to contact the second surface of the mold compound, the conductive plate configured to be coupled to the voltage that is approximately one half the high voltage.

20. The test handler of claim 19, and further comprising:

a first capacitor coupled in series between the first conductive slug and the conductive plate of the first plunger;

a second capacitor coupled in series between the conductive plate of the first plunger and the third conductive slug of the test handler;

a third capacitor coupled in series between the second conductive slug of the test handler and the conductive plate of the second plunger; and a fourth capacitor coupled in series between the conductive plate of the second plunger and the fourth conductive slug of the test handler;

wherein the first, second, third, and fourth capacitors have a same capacitance.

* * * * *